(12) United States Patent
Abaza et al.

(10) Patent No.: US 12,720,829 B2
(45) Date of Patent: Aug. 25, 2026

(54) DEVICE AND METHOD FOR INHIBITING A SUBSTRATE CURRENT IN AN IC SEMICONDUCTOR SUBSTRATE

(71) Applicants: Elmos Semiconductor SE, Dortmund (DE); Hyundai Mobis Co., Ltd., Seoul (KR)

(72) Inventors: Fikret Abaza, Dortmund (DE); Andre Sudhaus, Dortmund (DE); Uwe Friemann, Dortmund (DE); Andreas Friesen, Dortmund (DE); Mats Schmalhorst, Dortmund (DE); Marco Liedtke, Dortmund (DE)

(73) Assignees: Elmos Semiconductor SE, Leverkusen (DE); Hyundai Mobis Co., Ltd., Seoul (KR)

( * ) Notice: Subject to any disclaimer, the term of this patent is extended or adjusted under 35 U.S.C. 154(b) by 944 days.

(21) Appl. No.: 17/910,932

(22) PCT Filed: Mar. 18, 2021

(86) PCT No.: PCT/EP2021/057001
§ 371 (c)(1),
(2) Date: Sep. 12, 2022

(87) PCT Pub. No.: WO2021/185989
PCT Pub. Date: Sep. 23, 2021

(65) Prior Publication Data

US 2023/0163173 A1 May 25, 2023

(30) Foreign Application Priority Data

Mar. 18, 2020 (DE) ..................... 10 2020 107 479.4

(51) Int. Cl.
*H02H 3/00* (2006.01)
*B60R 21/01* (2006.01)
(Continued)

(52) U.S. Cl.
CPC ............ *H10D 62/81* (2025.01); *B60R 21/01* (2013.01); *H10D 84/0109* (2025.01);
(Continued)

(58) Field of Classification Search
CPC .. H01L 29/12; H01L 29/218249; B60R 21/01
(Continued)

(56) References Cited

U.S. PATENT DOCUMENTS

2005/0110111 A1 5/2005 Horn
2008/0023769 A1 1/2008 Alberkrack et al.
(Continued)

FOREIGN PATENT DOCUMENTS

DE 4432301 A1 3/1996
DE 102005048239 B3 5/2007
(Continued)

OTHER PUBLICATIONS

Abstract of DE 44 323 01 in PE2E Search.*
(Continued)

*Primary Examiner* — Crystal L Hammond
*Assistant Examiner* — Lucy M Thomas
(74) *Attorney, Agent, or Firm* — Mindful IP PLLC

(57) ABSTRACT

Devices and methods prevent injection of a substrate current into the substrate Sub of a CMOS circuit. The devices detect the potential of a contact of the integrated CMOS circuit, compare the value of the potential detected with a reference value and connect the contact to a leakage circuit node for discharging the current such that same does not flow to ground via the parasitic bipolar lateral structure. The leakage circuit node can be connected to the reference potential line or to another line that has a higher potential than the reference potential line. This electrical connection is acti-
(Continued)

vated when the value of the potential of the contact is lower than or equal to a reference value.

25 Claims, 23 Drawing Sheets

(51) Int. Cl.
*H10D 62/81* (2025.01)
*H10D 84/01* (2025.01)
*H10D 84/03* (2025.01)
*H10D 89/60* (2025.01)

(52) U.S. Cl.
CPC .. *H10D 84/038* (2025.01); *B60R 2021/01211* (2013.01); *B60R 2021/01272* (2013.01); *H10D 89/601* (2025.01)

(58) Field of Classification Search
USPC ........................................................... 361/88
See application file for complete search history.

(56) References Cited

U.S. PATENT DOCUMENTS

2012/0176161 A1 7/2012 Petruzzi
2019/0128945 A1* 5/2019 Cho .................... B60R 21/0173
2019/0190248 A1* 6/2019 Colarossi ............... H02H 3/305
2019/0257872 A1* 8/2019 Colarossi ............. G01R 31/006
2022/0118930 A1* 4/2022 Sudhaus ................... G05F 1/56

FOREIGN PATENT DOCUMENTS

| | | | |
|---|---|---|---|
| DE | 602004006973 | T2 | 2/2008 |
| EP | 0847089 | A1 | 6/1998 |
| KR | 1020070006448 | A | 1/2007 |
| KR | 1020070029693 | A | 3/2007 |
| WO | 2010095003 | A1 | 8/2010 |

OTHER PUBLICATIONS

Office Action issued on Jul. 4, 2024 in correlated Korean Application No. 10-2022-7031077, with translation in English.
International Search Report mailed Jun. 4, 2021 re PCT/EP2021/057001 (original and English translation, 6 pages).
Written Opinion mailed Jun. 4, 2021 re PCT/EP2021/057001 (original and English translation, 9 pages).

* cited by examiner

PDL
ABK
T1L
D
S
GND
PSUB
$NPN_{paraL}$
GND
OC
PDCL
VG1L
D1
OPOL
OPOL2
D2
OP
GC

GND
Verf
UVL
VSTL
VG3L
R2
VDD1
T3
GND
REV_DET

PDS
T1H
D
S
VG1H
GC
NPN
paraH
OC
PSUB
GND
PDH
PDCH
IN
T2
D
S
GND
VG2
OPOH
ABK

V
T5
I2
K3
IQ2
VDD2
GND
IP
T4
K1
R3
K2
IQ1
VDD2
UVL

DEVICE AND METHOD FOR INHIBITING A SUBSTRATE CURRENT IN AN IC SEMICONDUCTOR SUBSTRATE

CROSS REFERENCE TO RELATED APPLICATIONS

The present patent application is a national stage of, and claims priority to, PCT Application No. PCT/EP2021/057001, filed on Mar. 18, 2021, which application claims the priority of the German patent application 10 2020 107 479.4 filed Mar. 18, 2020, the disclosures of which are incorporated by reference in the present patent application in their entireties.

BACKGROUND

The disclosure is directed to various devices and methods for preventing substrate current injection into the substrate Sub of a CMOS circuit.

The disclosure is primarily suitable for improving the reliability of the proper functioning of airbag ignition circuits, which are typically embodied as integrated circuits. Examples of airbag circuits of this type are described in DE-A-44 32 301, DE-T-60 2004 006 973 and DE-B-10 2005 048 239.

Various product recalls by automobile manufacturers became known in the immediate temporal context of the creation of this disclosure, in which airbags did not open due to devices according to the prior art known at the time of the application.

New previously unknown requirements for safety devices of this type were thereby determined by the automobile manufacturers concerned and passed on to the suppliers. Investigations have shown that problems can occur on the terminals of CMOS circuits that are routed to the outside. These terminals of the IC are typically connected via bonding wires to the conductors of a lead frame, which has the external terminal contacts of the encapsulated IC component that are led to the outside. A terminal of this type of the CMOS circuit can, for example, be loaded with ground or with another potential as a result of a short circuit in a line that is connected to the associated external terminal contact of the IC and is routed in the vehicle or as a result of consequential effects due to parasitic inductances and capacitances of the lines and terminals having a particularly high negative potential which is below the potential of the semiconductor substrate in which the CMOS circuit is integrated. A lateral parasitic bipolar NPN transistor can then arise, namely in combination with electronic components or those components that are arranged adjacent to the electronic component that is connected to an external terminal that is erroneously "below substrate potential", as will be explained below with reference to FIG. 1*a* (and FIGS. 1*b* and 1*c* and FIG. 2).

FIG. 1*a* shows a cross-section through a p-doped substrate Sub, in the upper side OS of which a plurality of n-doped N-regions NG, NG1, NG2, NG3 and NG4 are introduced. In this example, a MOS transistor is formed in the N-region NG, the transistor being able to be part of a circuit, e.g., an airbag ignition circuit, e.g., as a high-side transistor T1H or as a low-side transistor T1L. A guard ring structure, e.g., is identified by the N-region NG1. In this example, outside of this guard ring is another MOS transistor, which has two heavily n-doped connection regions NG2 and NG3 for the source and drain. A further N-region NG4 is shown on the right in FIG. 1*a* by way of example. The substrate Sub is connected to a substrate potential PSUB at a plurality of points.

In the example of FIG. 1*a*, at least three parasitic bipolar NPN transistors of this type NPN1, NPN2 and NPN3 or, formulated more generally, parasitic lateral bipolar NPN or PNP structures can arise. In this case, the base B of each NPN transistor is formed by the p-substrate Sub in the region between the N-regions NG and NG1, while the emitter E is represented by the terminal PDCL. The collectors C1, C2, C3 of the three transistors are formed by the N-regions NG1, NG2 (alternatively or additionally also NG3) and NG3.

If, now during operation of the circuit to which the MOS transistor T1H or T1L belongs, the potential at the terminal PDCL, i.e., at the drain terminal of a low-side transistor T1L or at the source terminal of a high-side transistor T1H falls below the substrate potential PSUB, which can happen as a result of typically unforeseeable events such as a short circuit, at least one of the three parasitic NPN transistors NPN1, NPN2 or NPN3 shown as an example begins to conduct, such that a current flows in the emitter, which is represented by the terminal PDCL. This current reaches the shown terminals of the other N-regions or the components of these N-regions, which each form the collector of the respective NPN transistor NPN1, NPN2 and NPN3. This in turn can cause these other electronic components to malfunction.

FIG. 1*b* shows a schematically simplified situation for a high-side output transistor T1H, the task of which is to connect the external terminal contact PDH assigned thereto, which is an external terminal of the IC, to the positive supply potential VDD via the further external terminal contact PDS. A safety transistor ST is typically also connected between the line carrying the positive supply potential VDD and the high-side output transistor T1H (see FIG. 2). In airbag circuits, the line carrying the positive supply potential VDD is typically, but not necessarily, the positive pole of the energy reserve. For the sake of simplicity, the safety transistor ST is not shown in FIG. 1*b*. The high-side output transistor T1H can typically be switched on by an ESD protection circuit via the control electrode VG1H of the high-side output transistor T1H, which is known in principle. Furthermore, a functional circuit GC (this is, e.g., the circuit for deploying an airbag in the event of a crash) can switch the high-side output transistor T1H on and off, wherein the ESD protection circuit is typically able to "overwrite" the functional circuit GC. Other implementations of the ESD protection circuit are possible. The problem occurs when a larger current is drawn from the external terminal contact PDH of the high-side output transistor T1H. This can occur, e.g., if, as a result of an accident as described above, the external terminal contact PDH is loaded with a significantly lower potential that does not correspond to the intended operating situations. The reasons therefor will not be discussed in more detail here since they are irrelevant for understanding the disclosure.

The high-side transistor T1H is typically formed in an n-doped well of the substrate Sub (see FIG. 1*a*). The substrate Sub of a CMOS circuit is preferably p-doped. Naturally, the polarities of the charge carriers can be reversed, which is unusual but can be technically carried out (and also applies to the example according to FIG. 1*a*). Although a p-doped substrate is assumed below, the disclosure therefore expressly also relates to CMOS circuits having an n-doped substrate.

It is now assumed that an n-well is connected to the external terminal contact PDH. The n-well can be, e.g., the construction of an ESD protection structure. The exact nature of the n-well is irrelevant for the disclosure, since only the formation of a parasitic NPN transistor $NPN_{paraL}$, $NPN_{paraH}$ is relevant here. So if a larger current is drawn from the external terminal contact PDH, this leads to a current flow from the n-well and thus to an opening of the unavoidable, parasitic PN diode between the n-well and the substrate Sub if the potential difference between the potential PSUB of the substrate Sub minus the potential of the n-well becomes negative and the negative threshold voltage of this PN diode is undershot. Typically, in modern CMOS circuits, the substrate is at the reference potential GND (hereinafter sometimes also referred to as reference potential line GND), which is indicated in the figures with dashed lines and which is typically ground. Since the CMOS circuit comprises a plurality of n-wells or, more generally, a plurality of n-doped regions in the substrate as device parts of other circuit parts OC of the circuit at potentials above the substrate potential, the current drawn is now supplied via the substrate contacts of the CMOS circuit, so that an equilibrium is established. The term n-well can also be understood here as an n-doped region within the substrate Sub. The other n-wells form a parasitic NPN structure with the substrate Sub of the CMOS circuit and the n-well of the high-side output transistor, the parasitic NPN structure then being able to be viewed here as a parasitic NPN transistor $NPN_{paraH}$ having a very low gain of typically less than 1. The parasitic NPN transistor $NPN_{paraH}$ can open at a sufficiently high extraction current despite low current gain and thus short-circuit other n-wells with the external terminal contact PDH at a very low potential, which can then lead to faults such as non-deployment of airbags that should be deployed by other driver circuits of the integrated CMOS circuit. Because this CMOS circuit has a plurality of driver circuits, wherein, depending on the type of crash (e.g., frontal or side impact), not all or others of the numerous airbags installed in the vehicle are deployed.

The analogous situation for a low-side output transistor T1L is shown in FIG. 1*c*. The task of the low-side output transistor T1L is to connect the external terminal contact PDL associated thereto, which is also an external terminal of the IC, to the negative supply potential of the reference potential line GND (hereinafter also referred to as reference potential GND). In airbag circuits, this is typically the negative pole of the energy reserve. The low-side output transistor T1L can be switched on by an ESD protection circuit, typically via the control electrode VG1L of the low-side output transistor T1L. Furthermore, the low-side output transistor T1L can be switched on and off by a functional circuit GC, wherein the ESD protection circuit is typically able to "overwrite" the functional circuit GC. The problem occurs when a larger current is drawn from the external terminal contact PDL of the low-side output transistor T1L.

The low-side transistor T1H again preferably comprises an n-doped well. The n-well of the low-side output transistor T1L is connected to the external terminal contact PDL. So if a current is drawn from the external terminal contact PDL by a potential that is negative with respect to the reference potential of the reference potential line GND, this leads to a current flow from the n-well of the low-side output transistor T1L and thus to the opening of the unavoidable, parasitic PN diode between n-well of the low-side output transistor T1L and the substrate Sub when the potential difference between the potential of the substrate Sub minus the potential of the n-well becomes negative and the negative threshold voltage of this PN diode is undershot. Since the CMOS circuit, as already described, comprises a plurality of n-wells in the substrate as device parts of other circuit parts OC of the CMOS circuit at potentials above the substrate potential, the current drawn is now supplied via the substrate contacts of the CMOS circuit, so that an equilibrium is established. The other n-wells form a parasitic NPN structure with the substrate of the CMOS circuit and the n-well of the high-side output transistor, the parasitic NPN structure then in turn being able to be viewed here as a parasitic NPN transistor $NPN_{paraL}$ having a very low gain of typically less than 1. The parasitic NPN transistor $NPN_{paraL}$ can open at a sufficiently high extraction current despite low current gain and thus short-circuit other n-wells with the external terminal contact PDL at a very low potential, which can then lead to errors such as non-deployment of airbags that should be deployed by other driver circuits of the integrated CMOS circuit.

FIG. 2 shows a typical airbag firing stage as is common in the prior art. The integrated CMOS ignition circuit IC is supplied with electrical energy via a positive supply voltage line VDD and a reference potential line GND. The representation is schematically simplified to facilitate understanding. The actual integrated circuit IS is located within the integrated CMOS circuit IC, the actual integrated circuit in this example comprising the actuation circuit that controls and monitors the airbag ignition function. Said circuit's details are irrelevant for understanding the disclosure. In FIGS. 1*b* and 1*c*, e.g., the integrated circuit IS of FIG. 2 is symbolized by the functional circuit GC. The circuit IS here generates the control signal for the control electrode of the high-side output transistor T1H and transmits said signal to the control electrode of the high-side output transistor T1H by means of the control signal line VG1H. The circuit IS also generates the control signal for the control electrode of the low-side output transistor T1L and transmits said signal to the control electrode of the low-side output transistor T1L via the control signal line VG1L. The circuit IS may (but does not have to) also generate the control signal for the control electrode of the safety transistor ST and transmits said signal by means of the control signal line VST via the external terminal contact PDG for connecting the control electrode of the safety transistor ST to the control electrode of the safety transistor ST.

The drain contact of the high-side output transistor T1H is connected to the source contact of the safety transistor ST via the external terminal contact PDS.

The source contact of the high-side output transistor T1H is connected to a first terminal of one or more squibs SQ of a vehicle occupant restraint system or a vehicle safety device via the external terminal contact PDH for the high-side output transistor T1H. A squib SQ is typically an electrically ignitable explosive charge for deploying an airbag.

The drain contact of the low-side output transistor T1L is connected to a second terminal of the squib SQ of the vehicle occupant restraint system or the vehicle safety device via the external terminal contact PDL for the low-side output transistor T1L.

The source contact of the low-side output transistor T1L is typically connected to the reference potential line GND.

The current carrying capacity of the low-side output transistor T1L and the high-side output transistor T1H are typically designed such that said transistors can reliably carry a very high current in a range of several amperes for a limited number of ignition cycles for the very short time of ignition of the squib SQ.

The drain contact of the safety transistor ST is typically connected to the supply voltage line VDD, while said safety transistor's ST source contact is connected to the external terminal contact PDS.

The external terminal contacts PDH and PDS, hereinafter referred to as contact or contacts for short, are external terminals on the IC to which lines laid in the vehicle are connected, which lead to one or more of the driver stage of the squib's high-side transistors T1H and low-side transistors T1L. Failures occur if these external lines carry an unintended potential, e.g., due to damage or as a result of parasitic elements such as inductances and capacitances, as previously described with reference to FIGS. 1*a*, 1*b* and 1*c*.

SUMMARY

The disclosure is based on the object of providing a solution which does not have the above disadvantages of the prior art, in particular with regard to the currents in parasitic structures, and which offers further advantages.

The disclosure relates to various devices and methods for preventing injection of a substrate current into the substrate Sub of a CMOS circuit. For this purpose, the devices carry out methods for preventing an injection of this type in different manners. Said devices detect the potential of a contact PDH, PDL of the integrated CMOS circuit, compare the value of the potential detected in this way with a reference value and connect the contact PDH, PDL to a leakage circuit node for discharging the current such that same does not flow to ground via the parasitic bipolar lateral structure, i.e., does not drain in the substrate. The leakage circuit node can be connected, e.g., to the reference potential line GND or to another line that has a higher potential than that of the reference potential line GND. This electrical connection is activated or initiated when the value of the potential of the contact PDH, PDL is lower than or equal to a reference value, wherein this reference value is lower than the value of the potential of the substrate Sub and/or lower than the value of the potential of the reference potential line GND or the other line mentioned above.

This object is achieved by a device according to any one of the independent devices claims and by a method according to any one of the independent method. Individual configurations of the devices and methods according to the disclosure are the subject matter of the dependent claims.

DESCRIPTION

In a first variant, the disclosure proposes a device for use in an integrated CMOS circuit which is integrated in a semiconductor substrate Sub doped with charge carriers of a first conductivity type, in particular in a p-doped semiconductor substrate Sub, which has

- a plurality of regions NG doped with charge carriers of a second conductivity type that is opposite to the first conductivity type, in particular a plurality of n-doped N-regions NG, which each form electronic components or in which electronic components are each formed,
- a monitoring circuit node PDH, PDL, which lies in one of the doped regions NG or is electrically connected to one or more of the doped regions NG and is to be monitored with regard to its potential, e.g. for reasons of ensuring the functionality of the CMOS circuit,
- wherein the semiconductor substrate Sub has a substrate potential PSUB applied thereto,
- wherein the CMOS circuit has a reference potential GND and
- wherein a parasitic bipolar lateral structure is formed, in particular a parasitic bipolar NPN lateral structure, between the doped region NG having the monitoring circuit node PDH, PDL and at least one doped region NG adjacent to this doped region NG or between at least one of the doped regions NG, to which the monitoring circuit node PDH, PDL is electrically connected, and a doped region NG adjacent to this doped region NG or a doped region NG adjacent to one of these doped regions NG,
- an electronic switch T2, T1L having a conduction path which is electrically connected on the one hand to the monitoring circuit node PDH, PDL and on the other hand to a leakage circuit node ABK for discharging current from the monitoring circuit node PDH, PDL, and having a control electrode for blocking and conducting switching of the line path,
- a monitoring circuit UVH, UVL for the monitoring circuit node PDH, PDL, the circuit detecting a potential value representing the potential at the monitoring circuit node PDH, PDL,
- wherein the monitoring circuit UVH, UVL has a comparator circuit which compares the detected potential value with a predetermined reference potential,
- wherein the reference potential is equal to or lower than the substrate potential PSUB, or equal to or lower than the reference potential GND, or equal to both the substrate potential PSUB and the reference potential GND, or lower than both the substrate potential PSUB and the reference potential GND, and
- wherein the monitoring circuit UVH, UVL directly or indirectly generates a switch-on signal for switching the electronic switch T2, T1L to conduction when the detected potential value is equal to the reference potential or is below the reference potential.

Accordingly, it is proposed according to this and the other variants to monitor the potential of a circuit node that could unintentionally activate a parasitic bipolar lateral structure formed in the semiconductor substrate when a reference potential is undershot. This would mean that substrate currents arise in the semiconductor substrate, said substrate currents being able to disturb the function of adjacent active regions of the semiconductor substrate in which further electronic components and circuits are formed. This is prevented by comparing the potential at said circuit node to be monitored (hereinafter referred to as the monitoring circuit node) with the reference potential, in order to ensure a current flow when the reference potential is undershot or is equal to this reference potential, said current flow not "spreading" in the semiconductor substrate but instead flowing within one or more active regions of the semiconductor substrate. For this purpose, an electronic switch is used, which is connected between the monitoring circuit node and a leakage circuit node. If the potential of the monitoring circuit node is equal to the reference potential or falls below this reference potential, the electronic switch is switched on (e.g., a switching transistor is switched on) in order to raise the potential at the monitoring circuit node again. The leakage circuit node therefore carries a potential that is above the reference potential. This reference potential in turn can be equal to or lower than the reference potential, which is usually ground, or equal to or lower than the substrate potential on which the semiconductor substrate lies. The idea is to use the electronic switch to raise the potential of the node, the potential of which is to be monitored again if necessary, if its potential, coming from a higher value, falls to the reference potential or to below the reference potential. Advantageously, the potential difference between the monitoring circuit node and the leakage circuit node should be sufficiently high for the voltage limitation function according to the disclosure at the monitoring circuit node, but on the other hand, it should also advantageously not be selected too high at the same time in order to minimize the electrical power to be used at the leakage circuit node to maintain this potential. The leakage circuit node should have as low a resistance as possible. In principle, the ground potential fulfills all of these properties, since it has both a low impedance and is also above the reference potential, in other words, the reference potential is chosen such that it is below the ground potential.

The aforementioned considerations regarding the nature of the leakage circuit node and the potential applied to same apply quite fundamentally to all configurations of the disclosure.

In a useful development, it can be provided that the monitoring circuit node PDH, PDL is an external terminal contact of the CMOS circuit that is led to the outside or is to be led to the outside or is electrically connected to an external terminal contact of the CMOS circuit that is led to the outside or is to be led to the outside. As already described above in connection with the problems sometimes encountered in the prior art, nodes of this type of an integrated CMOS circuit that either form an external terminal contact of the IC component or are connected to an external terminal contact of this type are be monitored with regard to their potential. External influences can unintentionally apply electrical potentials to such external terminal contacts, which are typically implemented in the form of pins or pads of housed ICs, which can be disadvantageous for the functionality of the CMOS circuit, which is described in detail above.

In a further advantageous example, it can be provided that the monitoring circuit node PDH, PDL is the output of a transistor of an output driver stage of the CMOS circuit.

Finally, in the example of the disclosure mentioned above, the transistor of the output driver stage can be a low-side transistor T1L connected to the reference potential GND, wherein the electronic switch T2 is arranged between the monitoring circuit nodes PDH, PDL and the leakage circuit node ABK (in other words, in terms of its conduction path, it is connected in parallel to the low-side transistor T1L).

In a further advantageous example of the variant described above, the transistor of the output driver stage can be a low-side transistor T1L connected to the reference potential GND, wherein this low-side transistor T1L forms the electronic switch. This is of particular importance and is possible, e.g., with transistors which are either connected to the reference potential, as is the case, e.g., on a low-side transistor of an output driver stage or are connected to the leakage circuit node. Such a transistor, which is also used for normal operation of the CMOS circuit, can then be switched on if necessary and then assumes the function of raising the potential at the monitoring circuit node to the reference potential or to the potential of the leakage circuit node. The functionally prescribed operation of such a transistor, which is part of a CMOS circuit working as intended, is retained. It is thus possible, so to speak, to "save" the electronic switch provided according to the disclosure in same applications.

In a further variant of the device according to the disclosure, the transistor of the output driver stage is a high-side transistor T1H of the output driver stage that is connected directly or indirectly to a supply potential VDD, wherein the electronic switch T2 is arranged between the monitoring circuit node PDH, PDL of the high-side transistor T1H and the leakage circuit node ABK.

To indicate or signal the fact that the monitoring circuit provided according to the disclosure for the monitoring circuit node outputs a signal for switching the electronic switch to conduction, the monitoring circuit can generate a relevant status signal, either internally or for external further processing. The information about the generation of this status signal can be stored temporarily or permanently in a memory, or a memory is provided for the temporary or permanent storage of information about the generation of the status signal.

In a further advantageous example, it can be provided that the CMOS circuit has an actuatable electronic component, such as a transistor, a thyristor or the like, electrically connected to the monitoring circuit node PDH, PDL, and a control circuit IS, GC for actuating the component for the purpose of the intended function of this component and other components that interact electrically with this component. As already described above, an electronic component, such as a transistor or a thyristor or other controllable electronic component, intended for the function of the CMOS circuit is typically connected to the monitoring circuit node. These types of electronic components intended for the function of the CMOS circuit are actuated by a control circuit for the intended operation of the CMOS circuit.

In a useful example of the disclosure, it is provided

- that the comparator circuit has an operational amplifier OP having a positive input terminal IP and a negative input terminal IN and having an output terminal OPOH, OPOL,
- that the reference potential is provided by a reference voltage source Vref (which is connected, e.g., between the reference potential GND and the positive input terminal IP of the operational amplifier OP),
- that the negative input terminal IN of the operational amplifier OP is connected to the monitoring circuit node PDH, PDL or is connected to same with the interposition of a diode D2 having a cathode electrically connected to the monitoring circuit node PDH, PDL and an anode electrically connected to the negative input terminal IN of the operational amplifier OP, and
- that the output terminal OPOH, OPOL of the operational amplifier OP is electrically connected to the control electrode of the electronic switch T2, T1L or connected to same with the interposition of a diode D1 having a cathode electrically connected to the control electrode of the electronic switch T2, T1L and an anode electrically connected to the output terminal OPOH, OPOL of the operational amplifier OP.

A pull-down resistor R6, which is electrically connected to the reference potential GND, can be electrically connected to the connection between the output terminal OPOH, OPOL of the operational amplifier OP and the control electrode of the electronic switch T2, T1L.

If desired, the operational amplifier OP can generate the switch-on signal for switching the electronic switch T2, T1L to conduction at its output terminal OPOH, OPOL and output said signal at its control electrode if the detected potential value is equal to or below the reference potential, wherein the operational amplifier OP outputs the status signal and the switch-on signal can also be used as a status signal.

A further advantageous example is characterized by a first transistor T4 having a source terminal, a drain terminal and a control electrode, a second transistor T5 having a source terminal, a drain terminal and a control electrode, a first current source IQ1 for the output of a first current I1 having an output terminal, a resistor R3, wherein the output terminal of the first current source IQ1 is electrically connected to the resistor R3 and same is electrically connected to the drain terminal of the first transistor T4, the source terminal of which is electrically connected to the reference potential GND, a second current source IQ2 for the output of a second current I2 having an output terminal which is electrically connected to the drain terminal of the second transistor T5, the source terminal of which is electrically connected to the monitoring circuit node PDH, PDL or to same with the interposition of a series connection composed of a resistor R4 and a diode D2 having an anode and a cathode, wherein either the anode of diode D2 is electrically connected to the source terminal of the second transistor T5 and the cathode of diode D2 is electrically connected to the resistor R4 and the resistor R4 is electrically connected to the monitoring circuit node PDH, PDL, or the resistor R4 is electrically connected to the source terminal of the second transistor T5 and the anode of diode D2 is electrically connected to resistor R4 and the cathode of diode D2 is connected to monitoring circuit node PDH, PDL, wherein the output terminal of the first current source IQ1 is electrically connected to the control electrode of the first transistor T4, wherein the drain terminal of the first transistor T4 is electrically connected to the control electrode of the second transistor T5, and an amplifier V having negative gain having an input that is electrically connected to the output terminal of the second current source IQ2 (and therefore to the drain terminal of the second transistor) and having an output OPOL, OPOH for outputting the switch-on signal for the electronic switch T2, T1L, wherein the output OPOL, OPOH of the amplifier V is electrically connected to the control electrode of the electronic switch T2, T1L or is electrically connected to same with the interposition of a diode D1 having a cathode electrically connected to the control electrode of the electronic switch T2, T1L and an anode electrically connected to the output OPOL, OPOH of the amplifier V.

A further alternative example of the device according to the disclosure is characterized by a first transistor T4 having a source terminal, a drain terminal and a control electrode, a second transistor T5 having a source terminal, a drain terminal and a control electrode, a first current source IQ1 for the output of a first current I1 having an output terminal, wherein the output terminal of the first current source IQ1 is electrically connected to the drain terminal of the first transistor T4, the source terminal of which is electrically connected to the reference potential GND, a second current source IQ2 for outputting a second current I2 having an output terminal which is electrically connected to the drain terminal of the second transistor T5, the source terminal of which is electrically connected to the monitoring circuit node PDH, PDL with the interposition of a resistor R4 or a diode D2, the anode of which is electrically connected to the source terminal of the second transistor T5 and the cathode of which is electrically connected to the monitoring circuit node PDH, PDL, wherein the output terminal of the first current source IQ1 is electrically connected to the control electrode of the first transistor T4, wherein the drain terminal of the first transistor T4 is electrically connected to the control electrode of the second transistor T5, and an amplifier V having negative gain having an input that is electrically connected to the output terminal of the second current source IQ2 (and therefore to the drain terminal of the second transistor) and having an output OPOL, OPOH for outputting the switch-on signal for the electronic switch T2, T1L, wherein the output OPOL, OPOH of the amplifier V is electrically connected to the control electrode of the electronic switch T2, T1L or is electrically connected to same with the interposition of a diode D1 having a cathode electrically connected to the control electrode of the electronic switch T2, T1L and an anode electrically connected to the output OPOL, OPOH of the amplifier V.

Finally, an additional possible variant of the device according to the disclosure is characterized by a first transistor T4 having a source terminal, a drain terminal and a control electrode, a second transistor T5 having a source terminal, a drain terminal and a control electrode, a first current source IQ1 for the output of a first current I1 having an output terminal, wherein the output terminal of the first current source IQ1 is electrically connected to the drain terminal of the first transistor T4, the source terminal of which is electrically connected to the reference potential GND, a second current source IQ2 for outputting a second current I2, having an output terminal which is electrically connected to the drain terminal of the second transistor T5, the source terminal of which is electrically connected to the monitoring circuit node PDH, PDL, wherein the output terminal of the first current source IQ1 is electrically connected to the control electrode of the first transistor T4, wherein the drain terminal of the first transistor T4 is electrically connected to the control electrode of the second transistor T5, and an amplifier V having negative gain having an input that is electrically connected to the output terminal of the second current source IQ2 (and therefore to the drain terminal of the second transistor) and having an output OPOL, OPOH for outputting the switch-on signal for the electronic switch T2, T1L, wherein the output OPOL, OPOH of the amplifier V is electrically connected to the control electrode of the electronic switch T2, T1L or is electrically connected to same with the interposition of a diode D1 having a cathode electrically connected to the control electrode of the electronic switch T2, T1L and an anode electrically connected to the output OPOL, OPOH of the amplifier V, and wherein the magnitude of the first current I1 of the first current source IQ1 is different from the magnitude of the second current I2 of the second current source IQ2 and/or the control electrode of the first transistor T4 has a different magnitude than the control electrode of the second transistor T5 and/or the first transistor T4 has a threshold voltage, the magnitude of which is different from that of the threshold voltage of the second transistor T5.

It should be pointed out once again at this point that a potential that is above the reference potential can be applied to the leakage circuit node ABK.

The disclosure also provides a device for monitoring the potential of a monitoring circuit node PDH, PDL of a CMOS circuit,

- wherein the monitoring circuit node PDH, PDL lies in a region NG doped with charge carriers of a second conductivity type, in particular in an n-doped N-region NG, or is electrically connected to one or more such regions NG,
- wherein the one or more such doped regions NG are formed in a semiconductor substrate Sub doped with charge carriers of a first conductivity type opposite to the second conductivity type, in particular in a p-doped semiconductor substrate Sub,
- wherein the semiconductor substrate Sub has a plurality of doped regions NG, which each form electronic components or in which electronic components are formed, and is acted upon by a substrate potential PSUB,
- wherein the CMOS circuit has a reference potential GND and
- wherein a parasitic bipolar lateral structure is formed, in particular a parasitic bipolar NPN lateral structure, between the doped region NG having the monitoring circuit node PDH, PDL and at least one doped region NG adjacent to this doped region NG or between at least one of the doped regions NG, to which the monitoring circuit node PDH, PDL is electrically connected, and a doped region NG adjacent to this doped region NG or a doped region NG adjacent to one of these doped regions NG,
- wherein a comparator circuit is provided for comparing the potential of the monitoring circuit node PDH, PDL with a reference potential which is equal to or lower than the reference potential GND or equal to both the substrate potential PSUB and the reference potential GND or lower than both the substrate potential PSUB and the reference potential GND,
- wherein the comparator circuit directly or indirectly generates a switching signal for switching an electronic switch T2, T1L to conduction, the electronic switch being able to be arranged between the monitoring circuit node PDH, PDL and a leakage circuit node ABK for discharging current, if the detected potential value (i.e., the potential of the monitoring circuit node) is lower than or equal to the reference potential.

In a useful example, it can be provided that the monitoring circuit node PDH, PDL is an external terminal contact of the CMOS circuit that is led to the outside or is to be led to the outside or is electrically connected to an external terminal contact of the CMOS circuit that is led to the outside or to be led to the outside.

In a further advantageous example, it can be provided that the monitoring circuit node PDH, PDL is the output of a transistor of an output driver stage of the CMOS circuit.

Furthermore, it can be provided according to the disclosure that the transistor of the output driver stage is a low-side transistor T1L connected to the reference potential GND and that the electronic switch is arranged between the monitoring circuit nodes PDH, PDL and the leakage circuit node ABK (in other words, is thus connected in parallel with the low-side transistor T1L with regard to its conduction path).

In an advantageous example, it can be provided that the transistor of the output driver stage is a low-side transistor T1L connected to the reference potential GND and that the low-side transistor T1L forms the electronic switch.

In a further advantageous example, it can be provided that the transistor of the output driver stage is a high-side transistor T1H of the output driver stage connected directly or indirectly to a supply potential VDD, and that the electronic switch T2 is arranged between the monitoring circuit node PDH, PDL of the high-side transistor T1H and the leakage circuit node ABK.

In a useful example, it is provided that the monitoring circuit UVH, UV outputs a status signal for signaling that the electronic switch T2, T1L is switched to conduction.

In a further useful example, it is provided that the information about the generation of the status signal can be stored temporarily or permanently in a memory, or a memory is provided for the temporary or permanent storage of information about the generation of the status signal.

In an advantageous example, it can be provided that the CMOS circuit has an actuatable electronic component, such as a transistor, a thyristor or the like, electrically connected to the monitoring circuit node PDH, PDL, and a control circuit IS, GC for actuating the component for the purpose of the intended function of this component and other components that interact electrically with this component.

In a useful example, it is provided

- that the comparator circuit has an operational amplifier OP having a positive input terminal IP and a negative input terminal IN and having an output terminal OPOH, OPOL,
- that the reference potential is provided by a reference voltage source Vref (which is connected, e.g., between the reference potential GND and the positive input terminal IP of the operational amplifier OP),
- that the negative input terminal IN of the operational amplifier OP is connected to the monitoring circuit node PDH, PDL or is connected to same with the interposition of a diode D2 having a cathode electrically connected to the monitoring circuit node PDH, PDL and an anode electrically connected to the negative input terminal IN of the operational amplifier OP, and
- that the output terminal OPOH, OPOL of the operational amplifier OP is electrically connected to the control electrode of the electronic switch T2, T1L or connected to same with the interposition of a diode D1 having a cathode electrically connected to the control electrode of the electronic switch T2, T1L and an anode electrically connected to the output terminal OPOH, OPOL of the operational amplifier OP.

A pull-down resistor R6, which is electrically connected to the reference potential GND, can be electrically connected to the connection between the output terminal OPOH, OPOL of the operational amplifier OP and the control electrode of the electronic switch T2, T1L.

If desired, the operational amplifier OP can generate the switch-on signal for switching the electronic switch T2, T1L to conduction at its output terminal OPOH, OPOL and output said signal at its control electrode if the detected potential value is equal to or below the reference potential, wherein the operational amplifier OP outputs the status signal and the switch-on signal can also be used as a status signal.

A further advantageous example is characterized by a first transistor T4 having a source terminal, a drain terminal and a control electrode, a second transistor T5 having a source terminal, a drain terminal and a control electrode, a first current source IQ1 for the output of a first current I1 having an output terminal, a resistor R3, wherein the output terminal of the first current source IQ1 is electrically connected to the resistor R3 and same is electrically connected to the drain terminal of the first transistor T4, the source terminal of which is electrically connected to the reference potential GND, a second current source IQ2 for the output of a second current I2 having an output terminal which is electrically connected to the drain terminal of the second transistor T5, the source terminal of which is electrically connected to the monitoring circuit node PDH, PDL or to same with the interposition of a series connection composed of a resistor R4 and a diode D2 having an anode and a cathode, wherein either the anode of diode D2 is electrically connected to the source terminal of the second transistor T5 and the cathode of diode D2 is electrically connected to the resistor R4 and the resistor R4 is electrically connected to the monitoring circuit node PDH, PDL, or the resistor R4 is electrically connected to the source terminal of the second transistor T5 and the anode of diode D2 is electrically connected to resistor R4 and the cathode of diode D2 is connected to monitoring circuit node PDH, PDL, wherein the output terminal of the first current source IQ1 is electrically connected to the control electrode of the first transistor T4, wherein the drain terminal of the first transistor T4 is electrically connected to the control electrode of the second transistor T5, and an amplifier V having negative gain having an input that is electrically connected to the output terminal of the second current source IQ2 (and therefore to the drain terminal of the second transistor) and having an output OPOL, OPOH for outputting the switch-on signal for the electronic switch T2, T1L, wherein the output OPOL, OPOH of the amplifier V is electrically connected to the control electrode of the electronic switch T2, T1L or is electrically connected to same with the interposition of a diode D1 having a cathode electrically connected to the control electrode of the electronic switch T2, T1L and an anode electrically connected to the output OPOL, OPOH of the amplifier V.

A further advantageous example is characterized by a first transistor T4 having a source terminal, a drain terminal and a control electrode, a second transistor T5 having a source terminal, a drain terminal and a control electrode, a first current source IQ1 for the output of a first current I1 having an output terminal, wherein the output terminal of the first current source IQ1 is electrically connected to the drain terminal of the first transistor T4, the source terminal of which is electrically connected to the reference potential GND, a second current source IQ2 for outputting a second current I2 having an output terminal which is electrically connected to the drain terminal of the second transistor T5, the source terminal of which is electrically connected to the monitoring circuit node PDH, PDL with the interposition of a resistor R4 or a diode D2, the anode of which is electrically connected to the source terminal of the second transistor T5 and the cathode of which is electrically connected to the monitoring circuit node PDH, PDL, wherein the output terminal of the first current source IQ1 is electrically connected to the control electrode of the first transistor T4, wherein the drain terminal of the first transistor T4 is electrically connected to the control electrode of the second transistor T5, and an amplifier V having negative gain having an input that is electrically connected to the output terminal of the second current source IQ2 (and therefore to the drain terminal of the second transistor) and having an output OPOL, OPOH for outputting the switch-on signal for the electronic switch T2, T1L, wherein the output OPOL, OPOH of the amplifier V is electrically connected to the control electrode of the electronic switch T2, T1L or is electrically connected to same with the interposition of a diode D1 having a cathode electrically connected to the control electrode of the electronic switch T2, T1L and an anode electrically connected to the output OPOL, OPOH of the amplifier V.

Finally, an additional possible variant of the device according to the disclosure is characterized by a first transistor T4 having a source terminal, a drain terminal and a control electrode, a second transistor T5 having a source terminal, a drain terminal and a control electrode, a first current source IQ1 for the output of a first current I1 having an output terminal, wherein the output terminal of the first current source IQ1 is electrically connected to the drain terminal of the first transistor T4, the source terminal of which is electrically connected to the reference potential GND, a second current source IQ2 for outputting a second current I2, having an output terminal which is electrically connected to the drain terminal of the second transistor T5, the source terminal of which is electrically connected to the monitoring circuit node PDH, PDL, wherein the output terminal of the first current source IQ1 is electrically connected to the control electrode of the first transistor T4, wherein the drain terminal of the first transistor T4 is electrically connected to the control electrode of the second transistor T5, and an amplifier V having negative gain having an input that is electrically connected to the output terminal of the second current source IQ2 (and therefore to the drain terminal of the second transistor) and having an output OPOL, OPOH for outputting the switch-on signal for the electronic switch T2, T1L, wherein the output OPOL, OPOH of the amplifier V is electrically connected to the control electrode of the electronic switch T2, T1L or is electrically connected to same with the interposition of a diode D1 having a cathode electrically connected to the control electrode of the electronic switch T2, T1L and an anode electrically connected to the output OPOL, OPOH of the amplifier V, and wherein the magnitude of the first current I1 of the first current source IQ1 is different from the magnitude of the second current I2 of the second current source IQ2 and/or the control electrode of the first transistor T4 has a different magnitude than the control electrode of the second transistor T5 and/or the first transistor T4 has a threshold voltage, the magnitude of which is different from that of the threshold voltage of the second transistor T5.

As already mentioned above, a potential that is above the reference potential can be applied to the leakage circuit node ABK.

A main application purpose of the disclosure is to be seen in ensuring the function when an activation element of a passive vehicle safety system is actuated in accordance with the regulations. The activation element is typically a pyrotechnic charge that is used to generate combustion gases to inflate an airbag or for a belt tensioner.

According to the disclosure, such a safety device for actuating an activation element of a passive vehicle safety system, in particular for actuating a pyrotechnic charge for, e.g., an airbag or a belt tensioner of a vehicle, is provided, having a CMOS circuit integrated in a semiconductor substrate Sub, the CMOS circuit having an output driver stage for driving the activation element SQ, wherein the semiconductor substrate Sub lies on a substrate potential PSUB and the CMOS circuit has a supply potential VDD and a reference potential GND, wherein the output driver stage has two external terminal contacts to be led to the outside or led to the outside for the connection to the activation element SQ and a high-side output transistor T1L and a low-side output transistor T1L, each of which forms a different one of the two external terminal contacts, at least one monitoring circuit UVH, UVL for monitoring the potential at one of the two external terminal contacts of the output stage, a connecting means for controllably connecting said one external terminal contact to a leakage circuit node ABK for discharging current, wherein the at least one monitoring circuit UVH, UVL detects a potential value representing the potential at one of the two external terminal contacts of the output driver stage and compares said potential value with a reference potential, wherein the reference potential is equal to or lower than the substrate potential PSUB, or equal to or lower than the reference potential GND, or equal to both the substrate potential PSUB and the reference potential GND, or lower than both the substrate potential PSUB and the reference potential GND, and wherein the connecting means can be actuated by the at least one monitoring circuit UVH, UVL for the purpose of connecting said external terminal contact to the leakage circuit node ABK if the detected potential value (i.e., the potential of said external terminal contact) is equal to or lower than the reference potential.

Such a safety device can advantageously be provided so that each external terminal contact of the output driver stage is associated with a monitoring circuit UVH, UVL for monitoring and detecting a potential value representing the potential at one of the two external terminal contacts, that each monitoring circuit UVH, UVL comprises a connecting means for the controlled connection of an external terminal contact to a leakage circuit node ABK or to a common leakage circuit node ABK for discharging current and that each connecting means can be actuated by the relevant monitoring circuit UVH, UVL for the purpose of connecting the relevant external terminal contact to the relevant or to the common leakage circuit node ABK if the detected potential value (i.e., the potential at the external terminal contact associated with the relevant monitoring circuit UVH, UVL) is equal to or is lower than the reference potential.

Furthermore, the disclosure relates to a method for monitoring the output driver stage of a CMOS circuit for actuating an activation element of a passive vehicle safety system, in particular for actuating a pyrotechnic charge for e.g., an airbag or a belt tensioner of a vehicle, wherein the CMOS circuit is integrated in a semiconductor substrate Sub, which has an output driver stage for actuating the activation element SQ, the semiconductor substrate Sub lies on a substrate potential PSUB and the CMOS circuit has a supply potential VDD and a reference potential GND, the output driver stage has two external terminal contacts that are to be led or are led to the outside for the connection to the activation element SQ and a high-side output transistor T1L and a low-side output transistor T1L, which are each electrically connected to another of the two external terminal contacts, wherein the following steps are carried out during the operation of the CMOS circuit:

detecting the potential of at least one of the two external terminal contacts and connecting said at least one external terminal contact to a leakage circuit node ABK of the CMOS circuit that is used to discharge current if the potential at the at least one external terminal contact is equal to or lower than the substrate potential PSUB or equal to or lower than the reference potential GND or equal to both the substrate potential PSUB and the reference potential GND or lower than both the substrate potential PSUB and the reference potential GND.

In a further example, this relates to a method for preventing the formation of a laterally directed substrate current in a semiconductor substrate Sub, in which a CMOS circuit is integrated and which has a plurality of regions NG doped with charge carriers of a second conductivity type that is opposite to the first conductivity type, in particular a plurality of n-doped N-regions NG, which each form electronic components or in which electronic components are each formed, a monitoring circuit node PDH, PDL, which lies in one of the doped regions NG or is electrically connected to one or more of the doped regions NG and is to be monitored with regard to its potential, (e.g. to ensure the functionality of the CMOS circuit), wherein the semiconductor substrate Sub has a substrate potential PSUB applied thereto, wherein the CMOS circuit has a reference potential GND and wherein a parasitic bipolar lateral structure is formed, in particular a parasitic bipolar NPN lateral structure, between the doped region NG having the monitoring circuit node PDH, PDL and at least one doped region NG adjacent to this doped region NG or between at least one of the doped regions NG, to which the monitoring circuit node PDH, PDL is electrically connected, and a doped region NG adjacent to this doped region NG or a doped region NG adjacent to one of these doped regions NG, wherein the following steps are carried out during the operation of the CMOS circuit:

detecting a potential value representing the potential at the monitoring circuit node PDH, PDL, comparing the detected potential value (i.e., the potential of the monitoring circuit node) with a reference potential that is equal to or lower than the substrate potential PSUB, or equal to or lower than the reference potential GND, or equal to both the substrate potential PSUB and the reference potential GND, or lower than both the substrate potential PSUB and the reference potential GND, and connecting the monitoring circuit node PDH, PDL to a leakage circuit node ABK serving to discharge current if the potential value (i.e., the potential at the monitoring circuit node) is equal to or lower than the reference value.

Furthermore, a further example relates to a device for use in an integrated CMOS circuit which is integrated in a semiconductor substrate Sub doped with charge carriers of a first conductivity type, in particular in a p-doped semiconductor substrate Sub, which has a plurality of regions NG doped with charge carriers of a second conductivity type that is opposite to the first conductivity type, in particular a plurality of n-doped N-regions NG, which each form electronic components or in which electronic components are each formed, a monitoring circuit node PDH, PDL, which lies in one of the doped regions NG or is electrically connected to one or more of the doped regions NG and is to be monitored with regard to its potential, (e.g. to ensure the functionality of the CMOS circuit), wherein the semiconductor substrate Sub has a substrate potential PSUB applied thereto, wherein the CMOS circuit has a reference potential GND and wherein a parasitic bipolar lateral structure is formed, in particular a parasitic bipolar NPN lateral structure, between the doped region NG having the monitoring circuit node PDH, PDL and at least one doped region NG adjacent to this doped region NG or between at least one of the doped regions NG, to which the monitoring circuit node PDH, PDL is electrically connected, and a doped region NG adjacent to this doped region NG or a doped region NG adjacent to one of these doped regions NG, wherein the following steps are carried out during the operation of the CMOS circuit:

a current source IQ3, an ohmic resistor R5 and a first transistor T6, which are connected in series between a supply potential VDD3 and the reference potential GND, wherein the first transistor T6 has a conduction path arranged between the ohmic resistor R5 and the reference potential GND and a control electrode, wherein the current source IQ3 feeds a current into a first circuit node K4 of the series circuit composed of the resistor R4 and the first transistor T6, wherein the first circuit node K4 and the control electrode of the first transistor T6 are electrically connected to one another, and a second transistor T2L having a conduction path and a control electrode, wherein the conduction path of the second transistor T2L is connected between the monitoring circuit node GEN_I/O and a leakage circuit node ABK, a second circuit node of the series circuit which is arranged between the ohmic resistor R5 and the first transistor T6 and is electrically connected to the control electrode of the second transistor T2L, wherein the second transistor T2L conducts when the potential of the monitoring circuit node GEN_I/O undershoots a predetermined reference value, which is defined by, among other things, the resistor R5 and/or the threshold voltages of the two transistors T6, T2L or the difference in the threshold voltages of the two transistors T6, T2L and/or the magnitudes of the control electrodes of the two transistors T6, T2L or the difference in the magnitudes of the control electrodes of the two transistors T6, T2L.

Finally, a further example relates to a device for an output transistor T2L, e.g., an output driver stage for in particular the actuation of an activation element of a passive vehicle safety system, in particular for the actuation of a pyrotechnic charge for e.g., an airbag or a belt tensioner of a vehicle, wherein the output transistor T2L is integrated in a semiconductor substrate Sub and is arranged between an external terminal contact GEN_I/O, which is led to the outside or is to be led to the outside, in particular being used to connect to the activation element, and a reference potential GND, and has a control electrode VG2L, wherein the semiconductor substrate Sub is doped with charge carriers of a first conductivity type and has a plurality of regions NG doped with charge carriers of a second conductivity type opposite to the first conductivity type, in particular a plurality of n-doped N-regions NG, which each form electronic components or in which electronic components are formed, wherein the external terminal contact GEN_I/O lies in one of the doped regions NG or is electrically connected to one or more of the doped regions NG and (i.e., for reasons of ensuring the functionality of the CMOS circuit) is to be monitored with regard to its potential, wherein the semiconductor substrate Sub has a substrate potential PSUB applied thereto, wherein the CMOS circuit has a reference potential GND and wherein a parasitic bipolar lateral structure is formed, in particular a parasitic bipolar NPN lateral structure, between the doped region NG having the external terminal contact GEN_I/O and at least one doped region NG adjacent to this doped region NG or between at least one of the doped regions NG, to which the external terminal contact GEN_I/O is electrically connected, and a doped region NG adjacent to said doped region NG or a doped region NG adjacent to one of these doped regions NG, wherein the device is provided with a current source IQ3, an ohmic resistor R5 and a first transistor T6, which are connected in series between a supply potential VDD3 and the reference potential GND, wherein the first transistor T6 has a conduction path arranged between the ohmic resistor R5 and the reference potential GND, a first circuit node K4 of the series circuit arranged between the current source IQ3 and the ohmic resistor R5, into which first circuit node the current source IQ3 feeds a current and which is electrically connected to the control electrode of the first transistor T6, a second transistor T2L having a conduction path and a control electrode, wherein the conduction path of the second transistor T2L is connected between the monitoring circuit node GEN_I/O and a leakage circuit node ABK and a second circuit node of the series circuit which is arranged between the ohmic resistor R5 and the first transistor T6 and is electrically connected to the control electrode of the second transistor T2L.

The above object is thus achieved by devices and methods for use in a CMOS integrated circuit. A possible device comprises a contact PDH, PDL of the CMOS circuit having a p-doped substrate Sub with an n-doped N-region NG. The N-region NG lies within the p-doped substrate Sub. Furthermore, the device comprises a line PDCH, PDCL, a reference potential line GND, an output transistor T1H, T1L, a functional circuit GC and optionally an ESD protection circuit. The N-region is electrically connected to the output line PDCH, PDCL, which in turn leads to the contact PDH, PDL. An optional ESD protection circuit may switch on the output transistor T1H, T1L in the event of an ESD event. The functional circuit GC, which represents the actual function of the CMOS circuit, can switch the output transistors T1H, T1L on and off, respectively. The ESD circuit can preferably "overwrite" the control command of the functional circuit GC for the output transistor T1H, T1L.

The device according to the disclosure now preferably comprises a switching transistor T2, which is preferably identical to this output transistor T1L in the case of monitoring the potential at an external contact PDL, PDH connected to a low-side output transistor T1L and in the case of a high-side output transistor T1H, is preferably implemented separately from this high-side output transistor T1H. One advantage is that in the case of a high-side output transistor T1H, the additional switching transistor T2 can also take over the ESD protection for the associated contact PDH against the reference potential line GND, as explained in more detail below in conjunction with the description of the figures. The device preferably comprises a monitoring circuit UVH, UVL. The monitoring circuit UVH, UVL detects the potential of the contact PDL, PDH and compares the value of the potential of the contact PDL, PDH with a reference value, preferably with a reference voltage. This can optionally be generated within the monitoring circuit UVH, UVL from the operating voltages. The monitoring circuit UVH, UVL now switches on the switching transistor T2, T1L if the value of the potential of the contact PDH, PDL is below the reference value. It is important for solving the problem that this reference value is preferably below the value of the potential of the substrate Sub and/or below the value of the potential of the reference potential line GND. The switching transistor T2, T1L thereby takes over a large part of the current incorrectly drawn from the contact PDH, PDL, the current therefore no longer flowing through the base-emitter diode of the parasitic NPN bipolar transistor $NPN_{paraH}$, $NPN_{paraL}$. This parasitic base-emitter current is thus no longer able to switch on the parasitic NPN transistor $NPN_{paraH}$, $NPN_{paraL}$ and in this way possibly cause increased substrate currents and/or eliminate well insulation and/or distort node or well potentials within the CMOS circuit.

The switching transistor T2, T1L thus connects the contact PDH, PDL to a reference potential line GND when said switching transistor is switched on by the monitoring circuit UVH, UVL as a result of an incorrect potential of the contact PDH, PDL.

In a further development of this basic structure, an optionally additional output of the monitoring circuit UVH, UVL can be used to generate a signaling for a current drain at the contact PDH, PDL, this signaling then preferably indicating that the switching transistor T2, T1L is or was switched on by the monitoring circuit UVH, UVL. This puts the device in a position to recognize this fault condition and, if necessary, to take preventive measures in the event that the current drain via the contact PDH, PDL is so large that the subsequent current supply via the switching transistor T2, T1L is no longer sufficient.

A possible implementation of a monitoring circuit for a device of the type described above can now be such that it comprises, e.g., a differential amplifier OP and a reference voltage source Vref. The operational amplifier OP in this case detects the potential of the contact PDL/PDH at said operational amplifier's negative input IN, preferably directly or via a diode D2 and thus indirectly, and the potential of the reference voltage source Vref at said operational amplifier's positive input IP. The operational amplifier OP can then switch on the switching transistor T2, T1L directly or indirectly via a further diode D1 by means of said operational amplifier's output OPOH, OPOL. The interconnection of the plurality of drivers of the control electrode of the switching transistor T2, T1L is advantageously designed such that the typically present ESD protection preferably has the highest priority with regard to switching on the switching transistor T2, T1L, switching on by the operational amplifier OP has the next highest priority and thus the actuation by the functional circuit GC has the lowest priority among these three switch-on options.

In a further development of this construction, the reference voltage of the reference voltage source Vref is selected such that the operational amplifier OP switches on the switching transistor T2, T1L by means of said switching transistor's output OPOH, OPOL when the value of the potential of the contact PDH, PDL is below the value of the potential of the substrate Sub and/or below the value of the potential of the reference potential line GND.

In a further development of this construction, an optionally additional output of the operational amplifier OP is used to generate said signaling for a current drain at the contact PDH, PDL. As previously mentioned, this signaling then indicates in an analogous manner that the switching transistor T2, T1L is or was switched on by the operational amplifier OP.

A specific implementation of this operational amplifier circuit is now described below. The specific, very compact implementation comprises a fourth transistor T4, a fifth transistor T5, a third resistor R3, a first current source IQ1, a second current source IQ2, a first node K1, a second node K2 and a third node K3. The third resistor R3 has a first terminal and a second terminal.

The fourth transistor T4 is connected to a reference potential GND with said fourth transistor's source terminal. The drain terminal of the fourth transistor is connected to the second node K2. The control electrode of the fourth transistor T4 is connected to the first node K1.

The first terminal of the third resistor R3 is connected to the first node K1. The second terminal of the third resistor R3 is connected to the second node K2.

The source terminal of the fifth transistor T5 is connected directly or indirectly, in particular via a second diode D2, to the external contact PDL, PDH to be monitored. The control electrode of the fifth transistor T5 is connected to the second node K2. The drain terminal of the fifth transistor T5 is connected to the third contact K3.

A possible value range of the potential of the third contact K3 can lead to the switching transistor T2 being switched on, as will be described further below.

The first current source IQ1 feeds a first current I1 into the first node K1. The second current source IQ2 feeds a second current I2 into the third node K3.

This construction and functional principles of the device according to the disclosure can be transferred to an airbag ignition stage, to name one of several possible application examples.

An airbag ignition stage of this type comprises a substrate Sub for the CMOS circuit, in which substrate the high-side output transistor T1H and the low-side output transistor T1L are located. An ignition element SQ, the squib, is connected in series between the low-side output transistor T1L and the high-side output transistor T1H, as is conventional in the prior art. The ignition element SQ typically has a first terminal and a second terminal. The use of the disclosure for the airbag ignition stage is characterized in that the airbag ignition stage is provided with at least one monitoring circuit UVH, UVL. Said monitoring circuit has means (in this case, e.g., in the form of switching transistors T1L, T2) for connecting at least one terminal of the ignition element to a reference potential line GND, these means T1L, T2 being able to be controlled by, among other things, the monitoring circuit UVH, UVL. It should be noted here that in some cases, as described above, these means, in particular the low-side output transistor T1L, can fulfill a double function. The monitoring circuit UVH, UVL detects the potential of at least one of the terminals of the ignition element SQ. If necessary, the monitoring circuit UVH, UVL causes the means T1L, T2 to connect said one terminal of the ignition element to the reference potential line GND if the value of the detected potential of the at least one terminal PDH, PDL is below the value of the potential of the substrate Sub and/or below the value of the potential of the reference potential line GND or below the value of a reference potential Vref, which is typically related to the potential of the reference potential line GND.

While the previous description also relates to an airbag ignition stage having a monitoring circuit at only one of the two terminals of the ignition element SQ, it is more favorable to monitor both terminals of the ignition element SQ.

An airbag ignition stage of this type in turn comprises a substrate Sub having a high-side output transistor T1H and having a low-side output transistor T1L. The ignition element SQ, i.e., the squib, is connected in series between the low-side output transistor T1L and the high-side output transistor T1H, as is conventional in the prior art. The ignition element SQ typically has a first terminal and a second terminal. The application of the disclosure is characterized in that the airbag ignition stage is provided with a first monitoring circuit UVH and with a second monitoring circuit UVL. The airbag ignition stage comprises first means (here in the form of the switching transistor T2) to connect the first terminal PDH of the ignition element to a reference potential line GND, and second means (here in the form of the low-side output transistor T1L) to connect the second terminal PDL of the ignition element with a reference potential line GND. The first means T2 can be controlled by the first monitoring circuit UVH. The second means T1L can be controlled by the second monitoring circuit UVL. The first monitoring circuit UVH detects the first potential of the first terminal PDH of the ignition element SQ. The second monitoring circuit UVL detects the second potential of the second terminal PDL of the ignition element SQ. The first monitoring circuit UVH causes the first means T2 to connect the first terminal PDH of the ignition element SQ to the reference potential line GND if the value of the detected first potential of the first terminal PDH is below the value of the potential of the substrate Sub and/or below the value of the potential of the reference potential line GND and/or below the value of a reference voltage Vref, which is related to the potential of the reference potential line GND. The second monitoring circuit UVL causes the second means T1L to connect the second terminal PDL of the ignition element SQ to the reference potential line GND if the value of the detected second potential of the second terminal PDL is below the value of the potential of the substrate Sub and/or below the value of the potential of the reference potential line GND.

For the sake of completeness, the following is presented as a further example of the principle of an IC output switching stage (FIG. 21) for the low-side output transistor T1L, in which the low-side output transistor T1L itself is used as a voltage measuring means to turn itself on. It is therefore expressly part of the disclosure that an output transistor T1L, T1H is used or can be used as part of the monitoring circuit UVH, UVL associated therewith.

A switching stage of this type comprises a contact PDL, a third current source IQ3, a fifth resistor R5, a sixth transistor T6, a fourth node K4, an output OPOL, a low-side connecting line PDCL and a reference potential line GND. The sixth transistor T6 has a first terminal and a second terminal and a control terminal. The low-side output transistor T1L has a first terminal and a second terminal and a control terminal. The third current source IQ3 feeds a third current I3 into the fourth node K4. The first terminal of the sixth transistor T6 is electrically connected to the output OPOL of the switching stage. The second terminal of the sixth transistor T6 is electrically connected to the reference potential line GND. The control terminal of the sixth transistor T6 is electrically connected to the fourth node K4. The first terminal of the low-side output transistor T1L is electrically connected to the low-side connection line PDCL. The second terminal of the low-side output transistor T1L is electrically connected to the reference potential line GND. The control terminal of the low-side output transistor T1L is electrically connected to the output OPOL of the switching stage.

The disclosure makes it possible to avoid, at least in part, the injection of currents into the substrate of IC circuits in fault cases where such currents can affect the functionality of other integrated circuit components or even lead to failures or malfunctions of such components. However, the advantages are not limited thereto.

The external terminal contacts of, e.g., output transistors, which are to be monitored with regard to undershooting potential, can also be connected to an ESD protection, which can be carried out as an integral part of the transistor, e.g., or as a circuit part designed in addition to the transistor. Finally, the ESD protection can also be embodied in the form of actuating the transistor, by means of which the transistor is switched on when there is an ESD event.

BRIEF DESCRIPTION OF THE DRAWINGS

Figure 1:
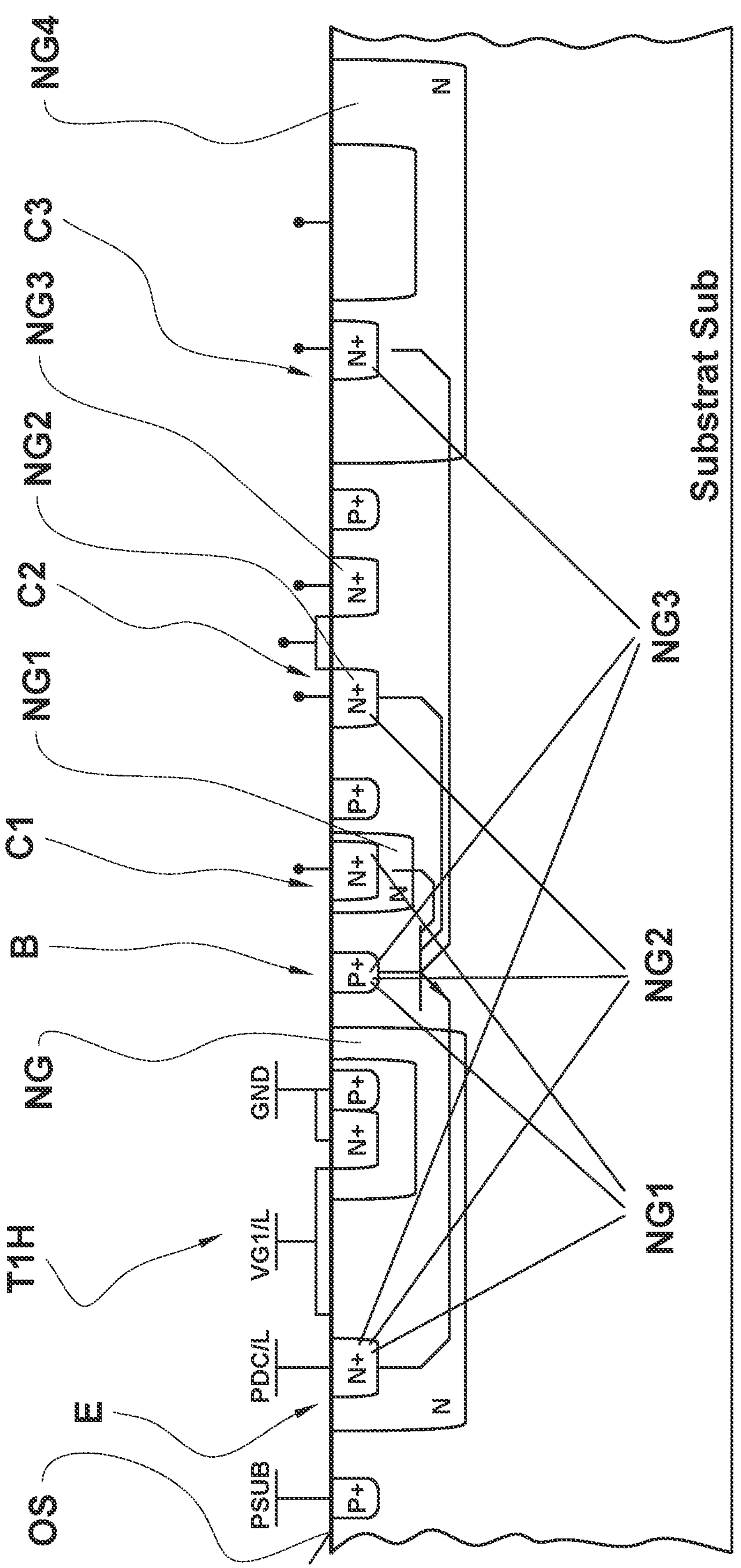
Figure 1:
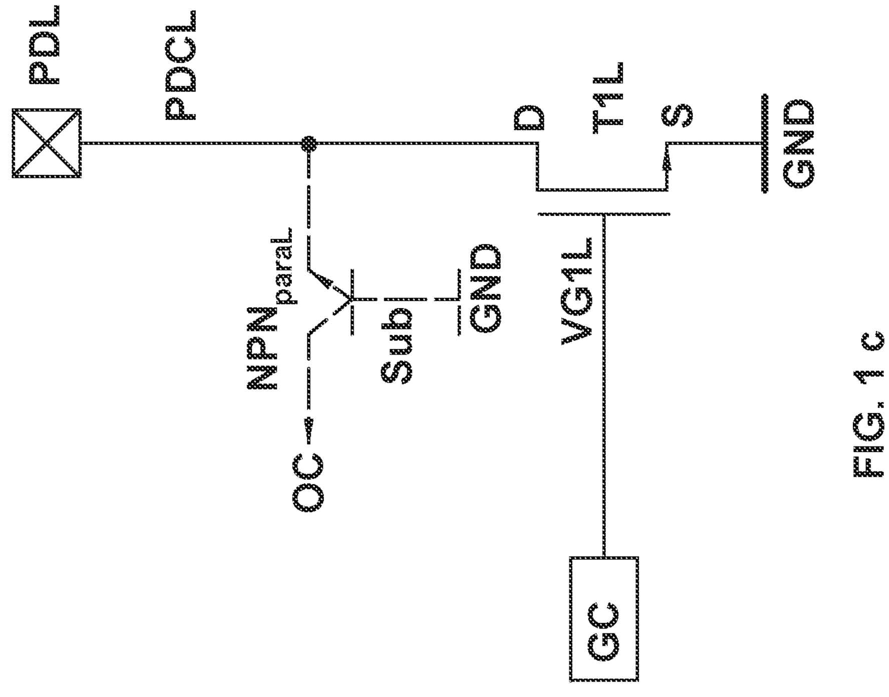
Figure 1:
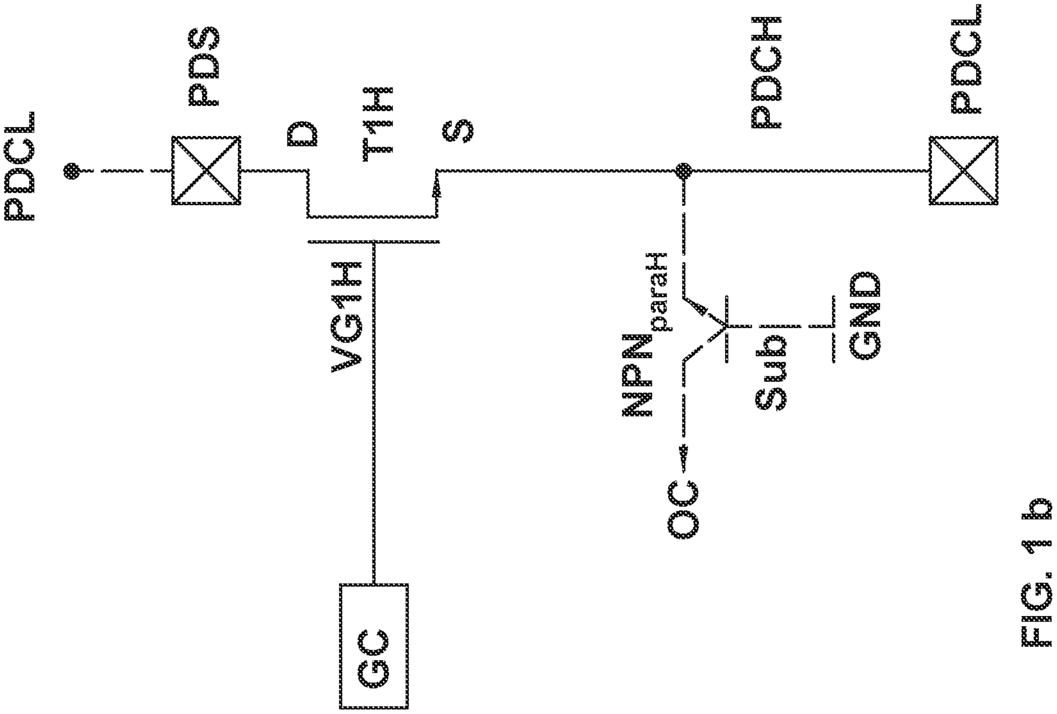

The disclosure is described in more detail below on the basis of several examples. Shown in detail:

FIG. 1*a* a representation to clarify the formation of parasitic structures in semiconductor substrates having integrated CMOS circuits when individual active regions have a potential below the substrate potential, FIGS. 1*b* and 1*c* the consequences of parasitic structures in high-side and low-side switches from the prior art, FIG. 2 an airbag ignition stage according to the prior art, FIG. 3 the basic idea of the disclosure applied to protecting a high-side output transistor T1H of an airbag ignition circuit, FIG. 4 a circuit corresponding to that in FIG. 3 with the additional feature that the fault state is signaled, FIG. 5 a circuit corresponding to that in FIG. 4 with the difference that the signaling of the fault state is generated differently than in the example in FIG. 3, FIG. 6 the basic idea of the disclosure applied to the protecting a low-side output transistor T1L with same as a switching transistor FIG. 6*a* the basic idea of the disclosure applied to protecting a low-side output transistor T1L with a separate switching transistor T2, FIG. 7 a circuit corresponding to that in FIG. 6 with the additional feature that the fault state is signaled, FIG. 8 a circuit corresponding to that in FIG. 7 with alternatively implemented signaling of the fault state, FIG. 9 the application of the disclosure in the airbag ignition stage of FIG. 2, which is now, according to the disclosure, a first monitoring circuit UVH for the contact PDH, to which the high-side output transistor T1H is connected within the IC, and a second monitoring circuit UVL contact PDL is added, to which the low-side output transistor T1L is connected inside the IC, FIG. 10 an exemplary implementation of the second monitoring circuit UVL for the contact PDL to which the low-side output transistor T1L is connected, FIG. 11 an exemplary implementation of the first monitoring circuit UVH for the contact PDH to which the high-side output transistor T1H is connected, FIG. 12 a circuit which corresponds largely to that in FIG. 10, wherein the difference between the circuits of FIGS. 10 and 12 corresponds to the difference in circuits between FIGS. 6 and 7, FIG. 13 a circuit which corresponds largely to that in FIG. 11, wherein the difference between the circuits of FIGS. 11 and 13 corresponds to the difference in circuits between FIGS. 3 and 4, FIG. 14 a possible implementation of the second monitoring circuit UVL, FIG. 15 a possible implementation of the first monitoring circuit UVH, FIG. 16 a further possible implementation of the second monitoring circuit UVL, wherein, in contrast to the second monitoring circuit UVL of FIG. 14, the third resistor R3 is replaced by a wire link and a diode D2, e.g., a Schottky diode, is connected to IN, FIG. 17 a further possible implementation of the second monitoring circuit UVL, wherein the third resistor R3 is replaced by a wire link in comparison with the second monitoring circuit UVL of FIG. 14 and a fourth resistor R4 is connected to IN, FIG. 18 a further possible implementation of the second monitoring circuit UVL, wherein, in contrast to the second monitoring circuit UVL of FIG. 14, a series circuit made up of a fourth resistor R4 and a diode D2 is replaced at IN, FIG. 19 a further possible implementation of the second monitoring circuit UVL (but also suitable as an implementation of the first monitoring circuit UVH), wherein different threshold voltages and current densities of the two transistors of a current mirror are used as an alternative or in combination, FIG. 20 a further possible implementation of the second monitoring circuit UVL (but also suitable as an implementation of the first monitoring circuit UVH) and FIG. 21 a further example of the monitoring circuit, in which the low-side output transistor T2L is part of the second monitoring circuit UVL, in that its gate-source path detects the potential of the contact GEN_I/O.

DESCRIPTION OF FIGURES

FIGS. 3 to 21 show

Figure 19:
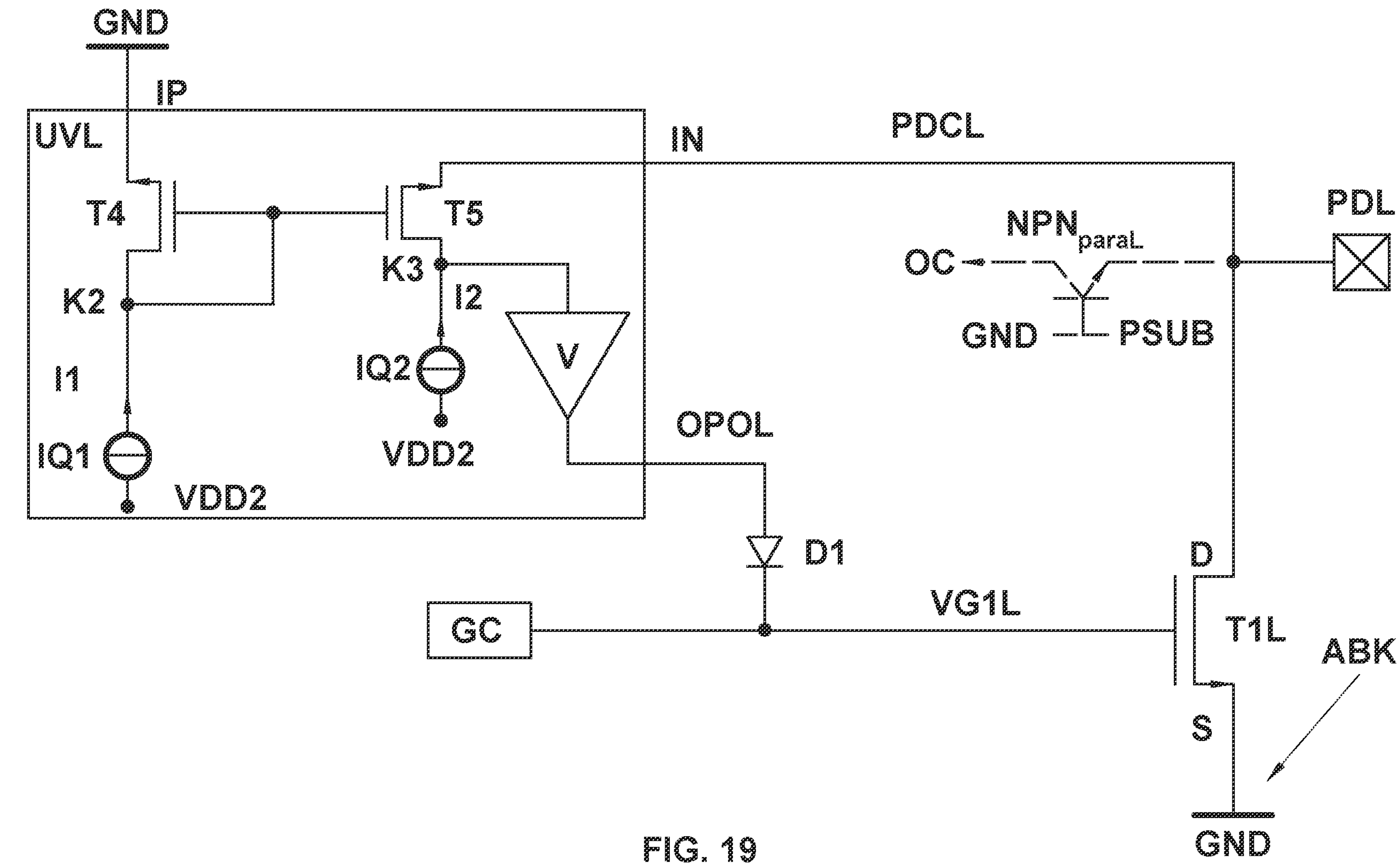
Figure 20:
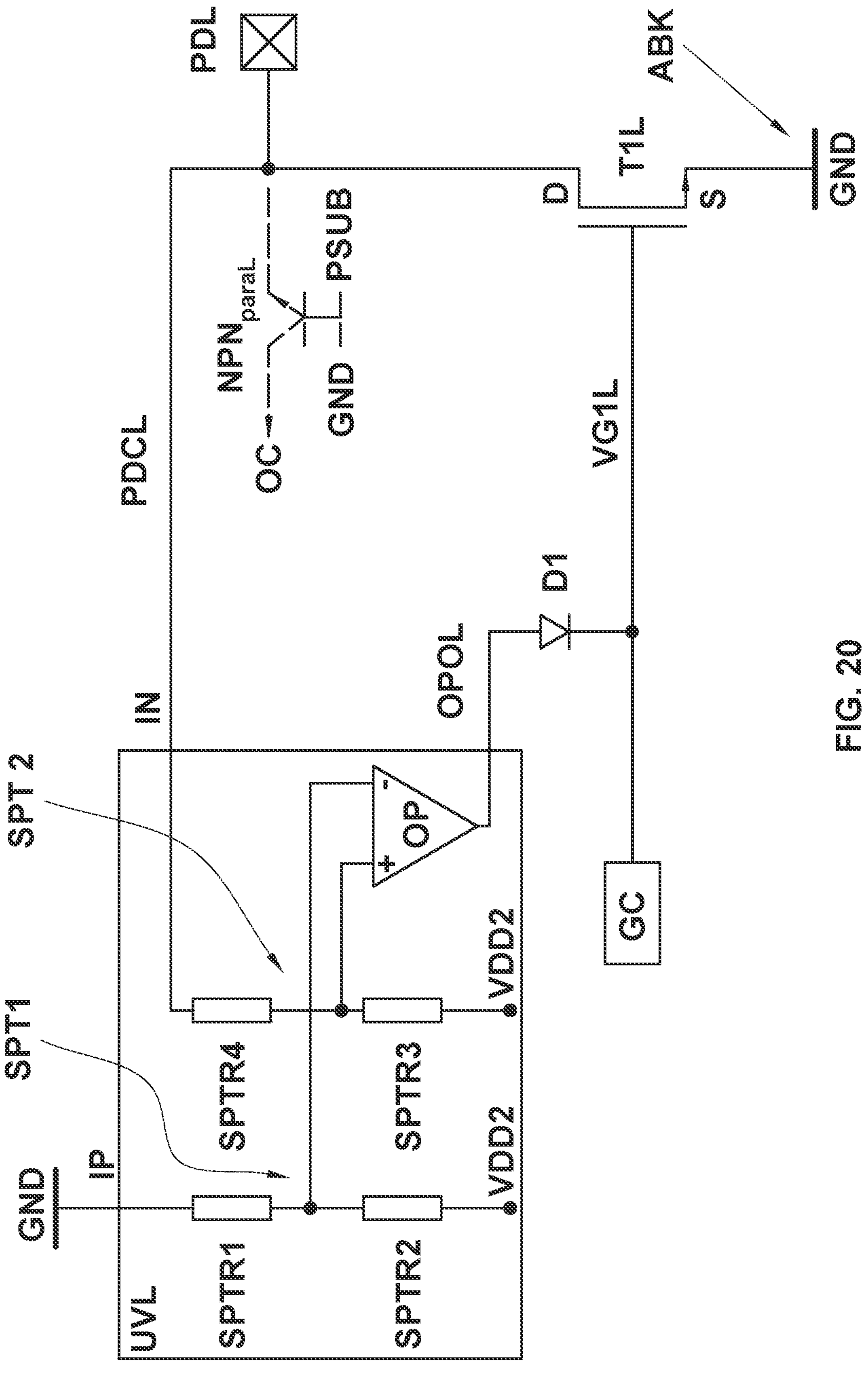
Figure 21:
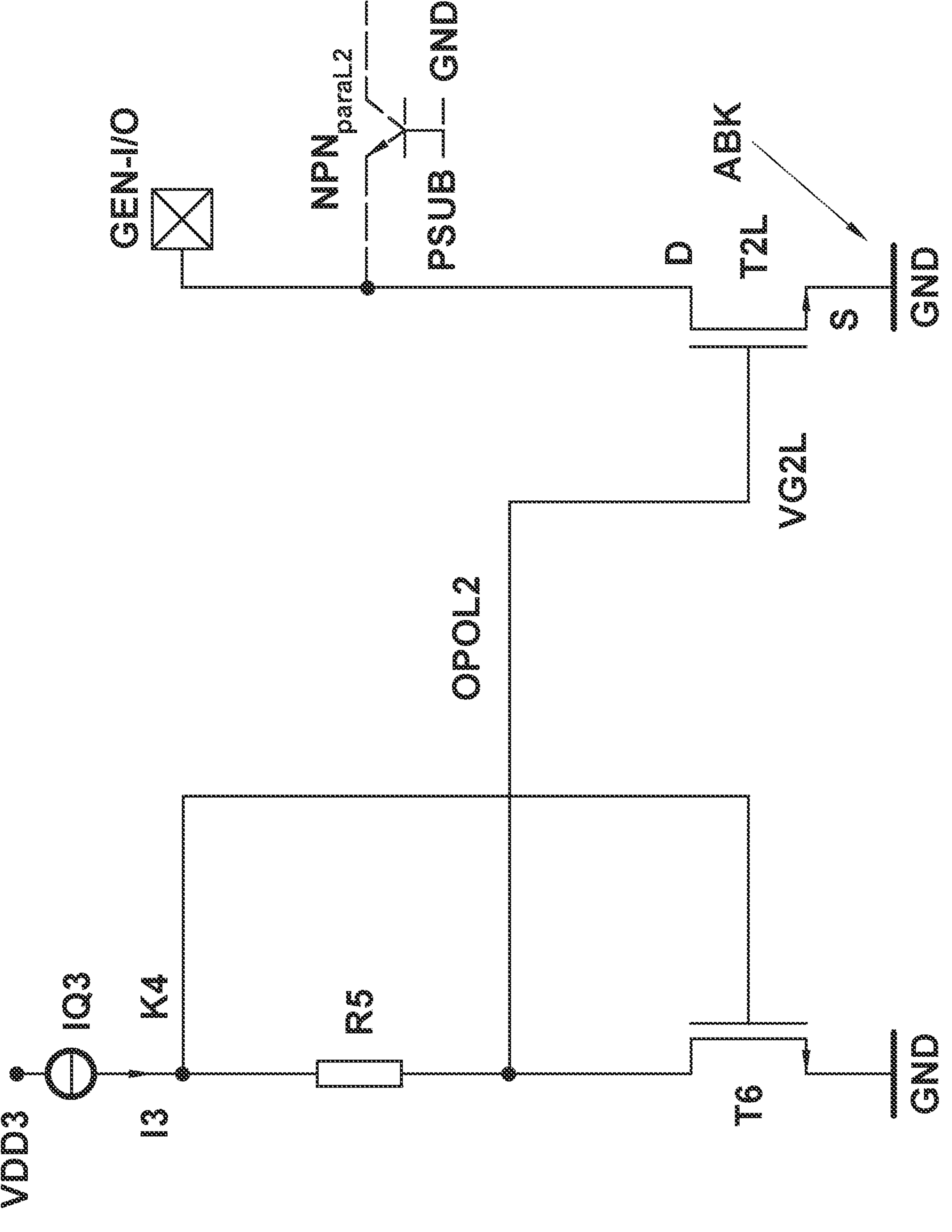

- the basic wiring for monitoring and raising the potential at a monitoring circuit node (FIGS. 3 to 5 for the case of connecting a high-side output transistor to the monitoring circuit node and in FIGS. 6, 6*a*, 7 and 8 for the case that a low-side output transistor is connected to the monitoring circuit node),
- the monitoring of two monitoring circuit nodes for the application of an output driver stage for the activation element of a passive vehicle safety system (FIG. 9),
- individual configurations for the monitoring circuits with a comparator circuit and actuation of an electronic switch (FIGS. 10 to 13),
- examples for the generation of reference voltages or reference potentials, with which the potential of the monitoring circuit node is compared to activate an increase in said monitoring circuit node's potential (FIGS. 14 to 20), and
- the implementation of an electrical biasing of an electronic switch, which is connected to the monitoring circuit node to be monitored and conducts when the reference potential is undershot (see FIG. 21).

FIGS. 3 to 21 also always mark the leakage circuit node ABK, wherein the reference potential GND is indicated as a possible potential at which this node should lie. It should be pointed out that these are examples and that the general properties already described above with regard to impedance and potential of the leakage circuit node, which have been described as an advantageous example in the previous description, also apply.

Figure 3:
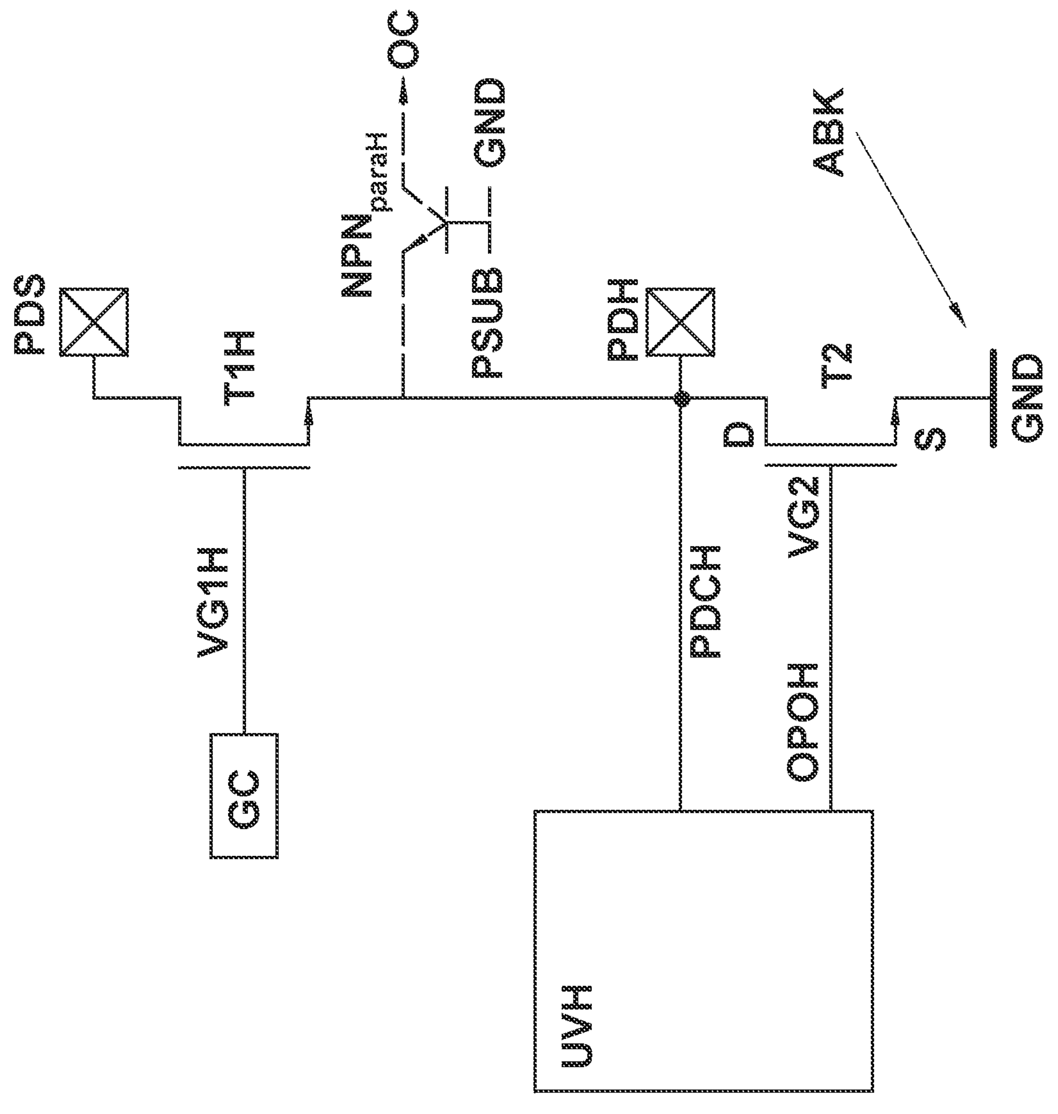

FIG. 3 shows the basic idea of the disclosure in its application for protecting a high-side output transistor T1H. For a better understanding, the circuit parts of FIG. 1*b* are also shown in FIG. 3 together with the parasitic NPN transistor $NPN_{paraH}$. In a modification of FIG. 1*b*, a monitoring circuit UVH is now provided for monitoring the potential at the contact PHD connected to the high-side output transistor T1H, to which contact, e.g., the explosive charge SQ of an airbag is connected via an external line. By means of an IC-internal high-side connection line PDCH, the monitoring circuit UVH detects the potential of the contact PDH, which is therefore the monitoring circuit node or which is electrically connected to the monitoring circuit node (which also applies correspondingly to the circuits of the further examples of the disclosure), and compares this potential with an internal or external reference potential. In this case, voltage sources or functionally similar device parts, such as diodes, can be connected between the monitoring circuit UVH and the high-side connecting line PDCH in order to be able to use a reference potential generated by this voltage source or functionally similar device parts, the value of which is equal to or greater than the value of the reference potential a reference potential line GND or at least to the value of the potential of the substrate Sub. An additional electronic switch T2 (hereinafter referred to as switching transistor) is controlled by the monitoring circuit UVH by means of a control signal line VG2 for the control electrode of the switching transistor T2. The monitoring circuit UVH typically switches on the switching transistor T2 when the potential of the contact PDH is below the reference potential GND of the reference potential line GND. At the very least, however, the monitoring circuit UVH should typically switch on the switching transistor T2 when the potential of the contact PDH is below the potential PSUB of the substrate Sub (which can occur when there is a fault). In these cases, the switching transistor T2 then supplies the current drawn at the contact PDH again and thus pulls the potential of the contact PDH back in the direction of the (reference) potential of the reference potential line. This prevents a further current injection into the substrate and thus the opening of the parasitic NPN transistor $NPN_{paraH}$. However, even if the switching transistor T2 cannot compensate for all the current drawn, the emitter-base current of the parasitic NPN transistor $NPN_{paraH}$ is reduced in magnitude, thereby reducing the effects of its opening. In the event that the substrate potential undershoot at contact PDH occurs as a result of an unintentional fault from outside, e.g., in the event of a crash (this contact is routed to the outside since explosive charge SQ is connected to same), time is gained in the circuit to be able to ignite further airbags via other driver stages. Since in some cases, considerable currents have to be compensated for, the switching transistor T2 typically has to be of a similar magnitude to the high-side output transistor T1H. Its service life in the event of said fault is of a similar magnitude to the service life of the high-side output transistor T1H in undisturbed ignition operation. However, this time is sufficient to ensure the ignition of the other ignition circuits of the airbag system by the integrated ignition device IC, which would otherwise possibly be disturbed by the "stray" substrate currents without the measure according to the disclosure.

In the circuit according to FIG. 3 and in all circuits of the examples of the disclosure, the leakage circuit node ABK is at the potential of the reference potential line GND, but this does not necessarily have to be the case. What is decisive for the selection of the potential of the leakage circuit node ABK is that the electronic switch T2 (or T1L) conducts when the potential at the monitoring circuit node PDH, PDL connected to same is equal to or below the reference potential.

Figure 4:
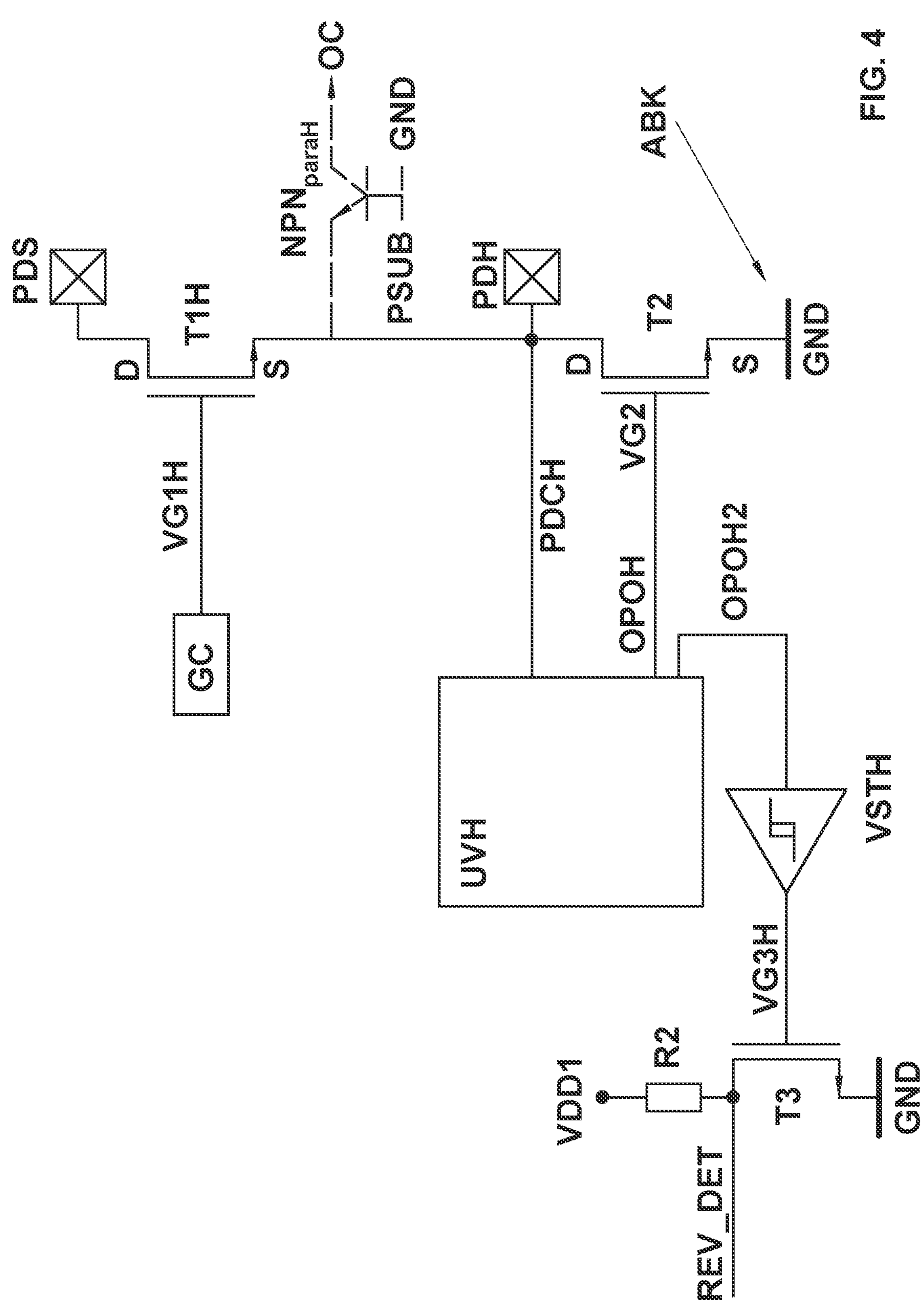

FIG. 4 corresponds to FIG. 3 with the additional feature that the monitoring circuit UVH now generates a second output signal OPO2H, which can be stabilized, e.g., but not absolutely necessarily, by a Schmitt trigger circuit VSTH, in order to then be able, by means of a signaling transistor T3H, in the event of a fault on a signaling line REV_DET, to be able to signal a substrate potential or reference potential undershoot, e.g. by a wired- or link.

If necessary, this signal can also be sent to a control unit or written to a memory in order to be able to understand the cause of a non-opening airbag (here said short circuit caused by the accident) in a later accident analysis, which can be important in claims for damages.

Figure 5:
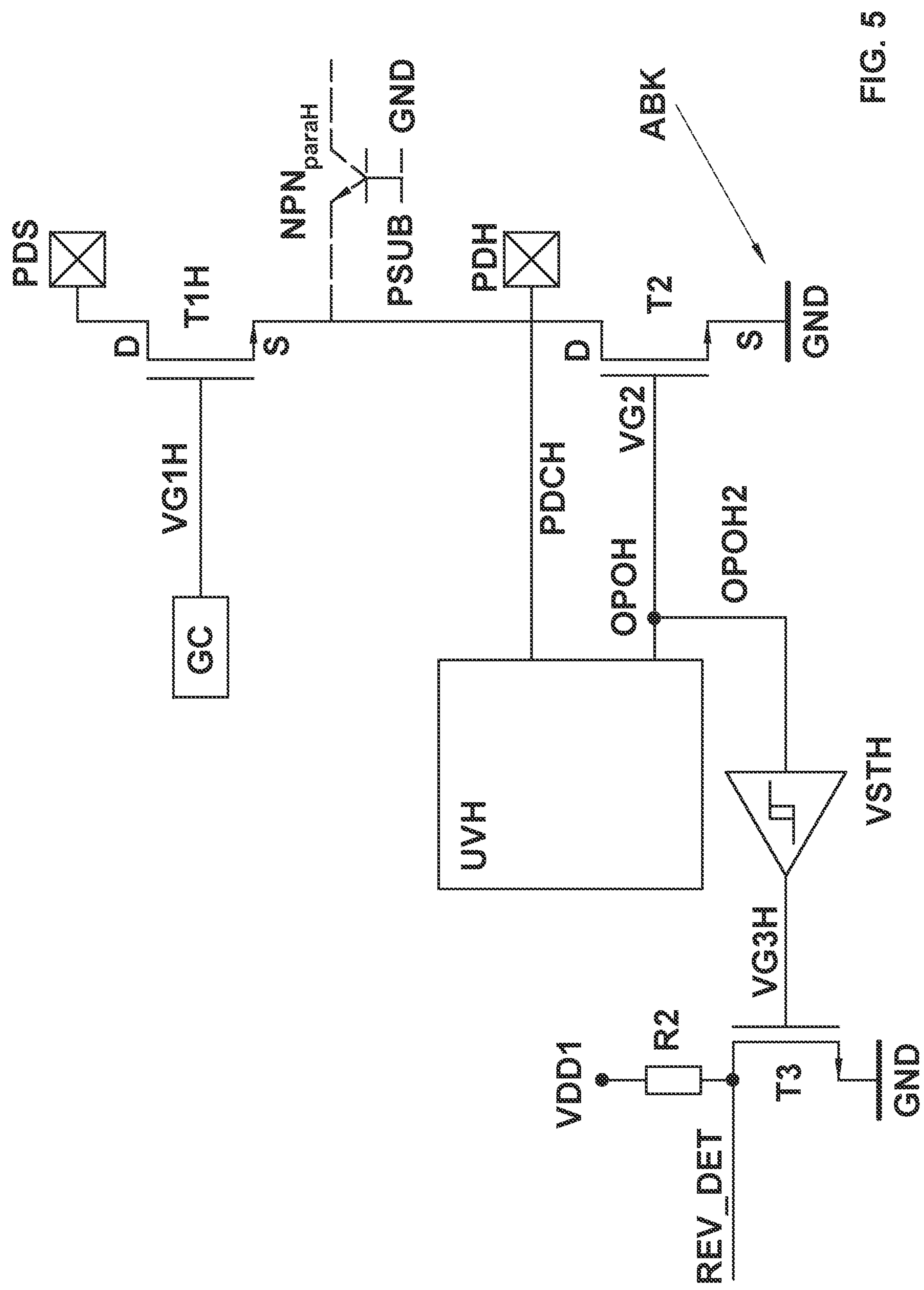

FIG. 5 corresponds to FIG. 4 with the difference that instead of a special second output signal OPO2H, the control signal on the control signal line VG2 for the control electrode of the switching transistor T2 is now used directly for signaling the fault.

Figure 6:
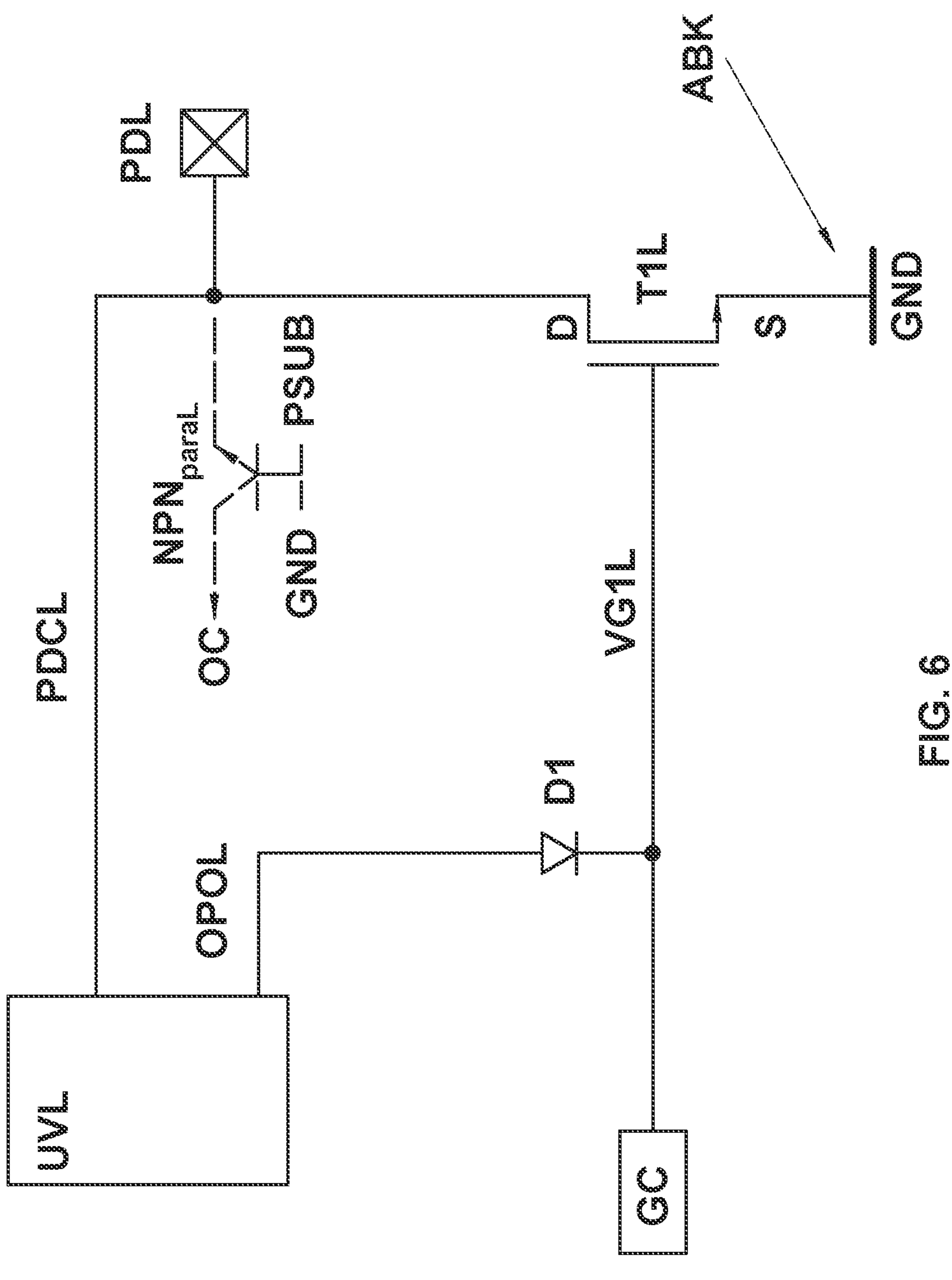
Figure 6:
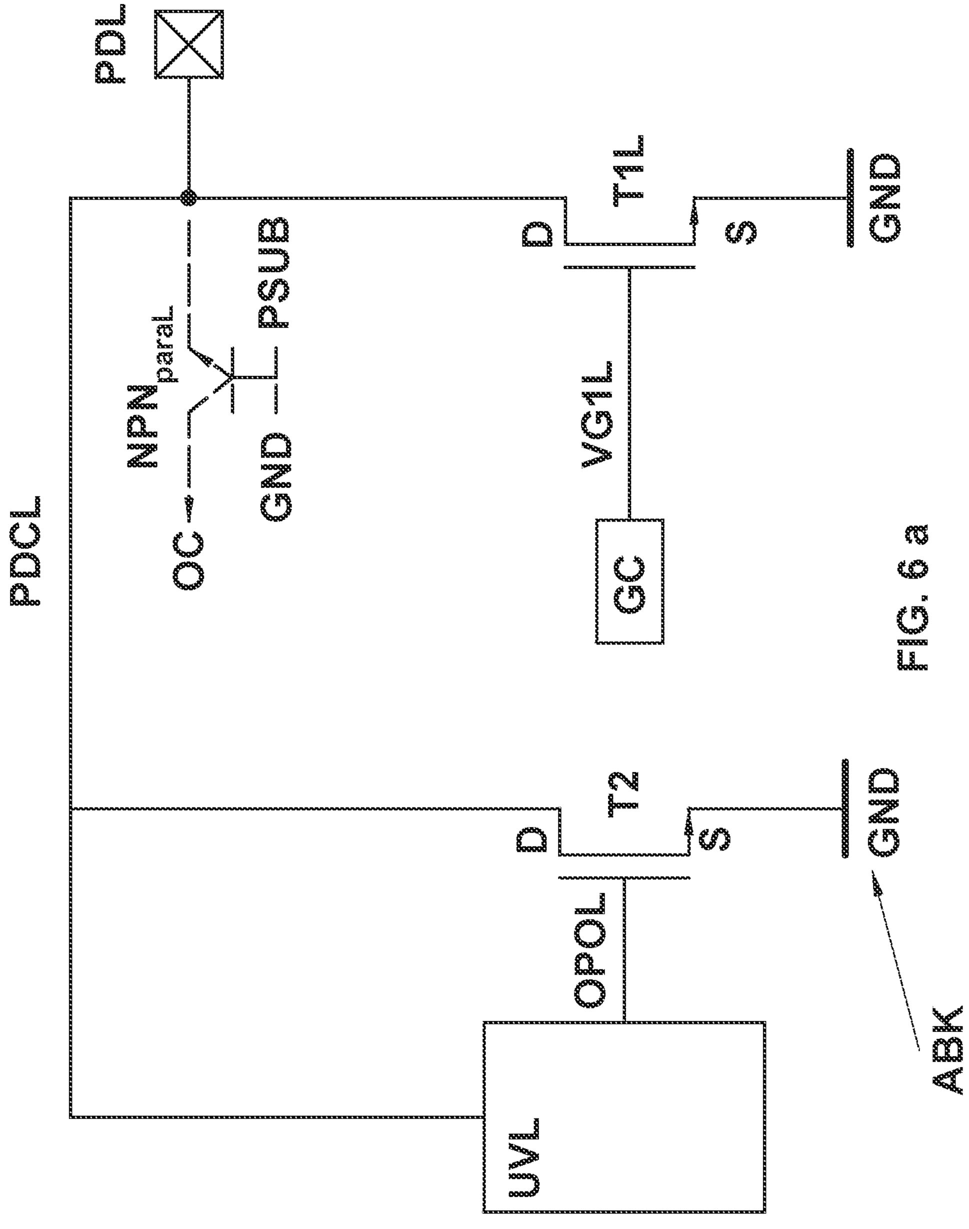

FIG. 6 now however shows the basic idea applied to the protection of a low-side output transistor T1L. For a better understanding, the circuit parts of FIG. 1*c* are also shown in FIG. 6 together with the parasitic NPN transistor $NPN_{paraL}$. In a modification to FIG. 1*c*, a monitoring circuit UVL is provided for monitoring the potential at the contact PDL (which is again the monitoring circuit node or a node electrically connected thereto) connected to the low-side output transistor T1L, to which, e.g., the explosive charge SQ of an airbag is connected. By means of the connection line PDCL leading to the contact PDL, the monitoring circuit UVL detects the potential of the contact PDL and compares this potential with an internal or external reference potential. In this case, voltage sources or functionally similar device parts, such as diodes, can be connected between the monitoring circuit UVL and the low-side connecting line PDCL, in order to be able to use a reference potential generated by these components, the value of which being equal to or greater than the value of the potential of a reference potential line GND or at least to the value of the potential PSUB of the substrate Sub.

In contrast to the circuit according to FIG. 3, however, an additional electronic switch T2 (hereinafter also referred to as switching transistor) is now not absolutely necessary. It was recognized when the disclosure arose that the low-side output transistor T1L can be used as a switching transistor of this type. In this type of example, the leakage circuit node ABK therefore has the potential GND of the reference potential line. The first diode D1 enables a current to be fed into the control signal line VG1L for the control electrode of the low-side output transistor T1L when said low-side output transistor is actuated by the monitoring circuit UVL. If, e.g., an ESD protection control responds or the functional circuit GC intended for the intended deployment of the airbag actuates the low-side output transistor T1L, the diode D1 blocks the forwarding of the respective actuation signal that transfers the low-side output transistor to the conductive state. The diode D1 is particularly advantageous if the output of the monitoring circuit UVL should have too low a resistance or if the monitoring circuit UVL outputs "binary" signals different from zero, namely a first signal with a first size, in which the low-side output transistor T1L is not yet switched on, and a second, typically larger signal to switch on the low-side output transistor T1L. The current coming from the monitoring circuit UVL, or rather the output voltage of this monitoring circuit UVL, is dimensioned such that the output signals of other circuits, namely those of the typically present ESD protection and the functional circuit GC, are overwritten and the low-side output transistor T1L becomes conductive and thus connects the reference potential line GND to the contact PDL. Thus, in the event of a fault, the low-side output transistor T1L is controlled by the monitoring circuit UVL via the control signal line VG1L. The monitoring circuit UVL typically switches on the low-side output transistor T1L when the potential of the contact PDL is below the reference potential of the reference potential line GND. However, at least the monitoring circuit UVL should switch on the low-side output transistor T1L when the potential of the contact PDL is below the potential PSUB of the substrate Sub, which can occur in the event of a fault. In these cases, the low-side output transistor T1L supplies the current drawn at the contact PDL and thus pulls the potential of the contact PDL back in the direction of the reference potential GND of the reference potential line. This then prevents a further current injection into the substrate and thus the opening of the parasitic NPN transistor $NPN_{paraL}$. However, even if the low-side output transistor T1L cannot compensate for all the current drawn, the emitter-base current of the parasitic NPN transistor $NPN_{paraL}$ is reduced in magnitude, thereby reducing the effects of its opening. In the event that the substrate potential undershoot at contact PDH occurs as a result of an unintentional fault from outside, e.g., in the event of a crash (this contact is routed to the outside since explosive charge SQ is connected to same), time is gained in the circuit to be able to ignite further airbags via other driver stages. In the event of a fault, the service life of the low-side output transistor T1L is similar to that of the high-side output transistor T1H in undisturbed ignition operation. However, this time is also sufficient here to ensure the ignition of other ignition circuits of the airbag system, which are also part of the CMOS circuit, by the functional circuit of the integrated ignition device IC, which otherwise could possibly be disturbed by the "stray" substrate currents without the measure according to the disclosure.

FIG. 6*a* shows an alternative circuit for discharging potentials at contact PDL with values below substrate potential but using a dedicated switching transistor T2 which is actuated by the monitoring circuit UVL instead of the low-side output transistor T1L (as in the example in FIG. 6). In this case, the leakage circuit node ABK can have a different potential that deviates from the reference potential GND.

Figure 7:
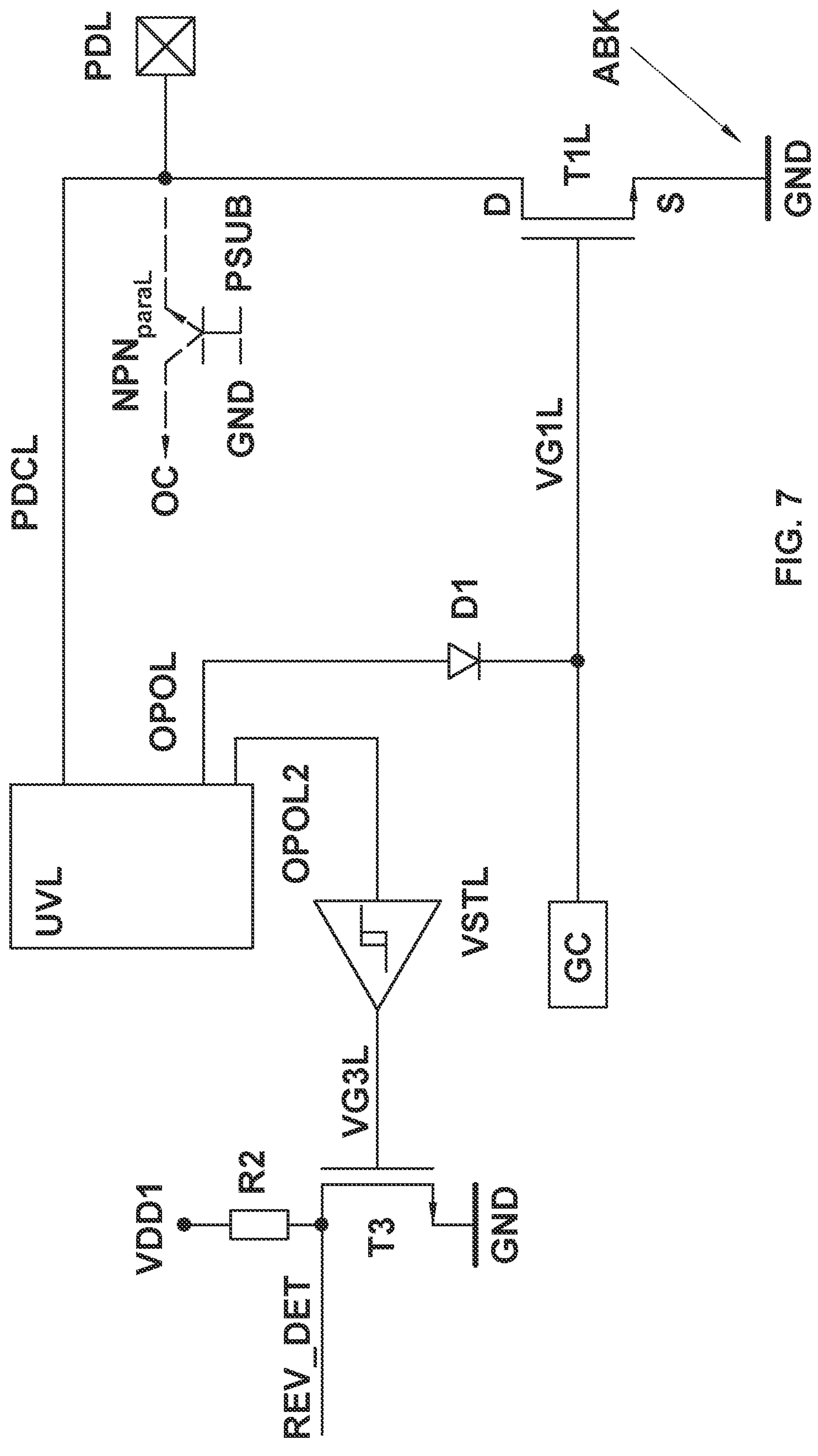

The circuit of FIG. 7 corresponds to that of FIG. 6 with the addition that the monitoring circuit UVL now generates a second output signal OPO2L for the contact PDL of the low-side output transistor T1L, said second output signal being able to be secured, e.g., by a Schmitt trigger VSTL, in the event of a fault to be able to signal over a signaling line REV_DET, e.g., a substrate potential or reference potential undershoot by a wired- or connection by means of a signaling transistor T3H.

If necessary, this signal can also be sent to a control unit or written to a memory in order to be able to understand the cause of a non-opening airbag (here said short circuit caused by the accident) in a later accident analysis, which can be important in claims for damages.

Figure 8:
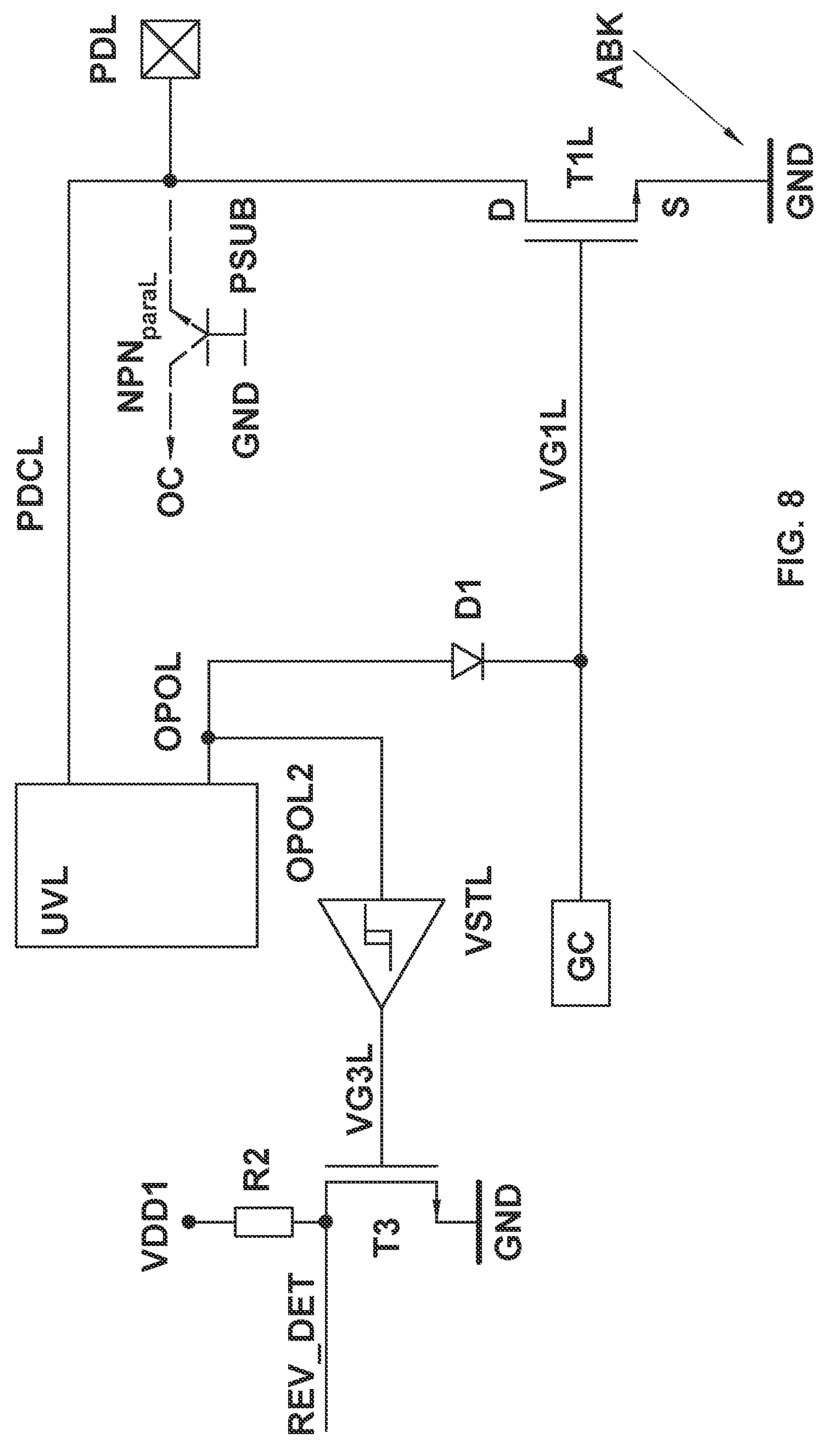

The circuit of FIG. 8 corresponds to that of FIG. 7 with the difference that instead of a special second output signal OPO2L, the control signal OPOL of the monitoring circuit UVL for actuating the low-side output transistor T1L is now used directly for signaling the fault.

Figure 2:
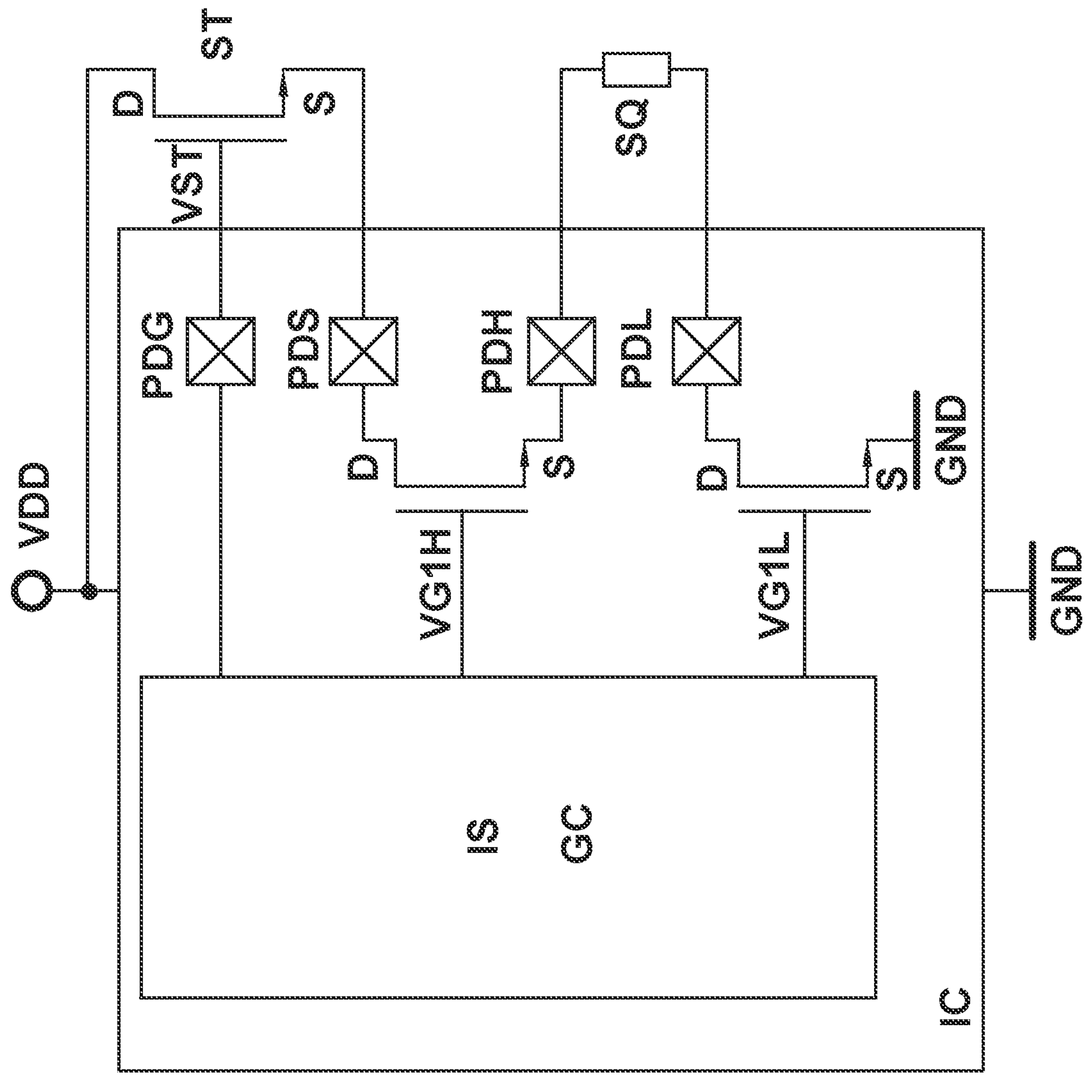
Figure 9:
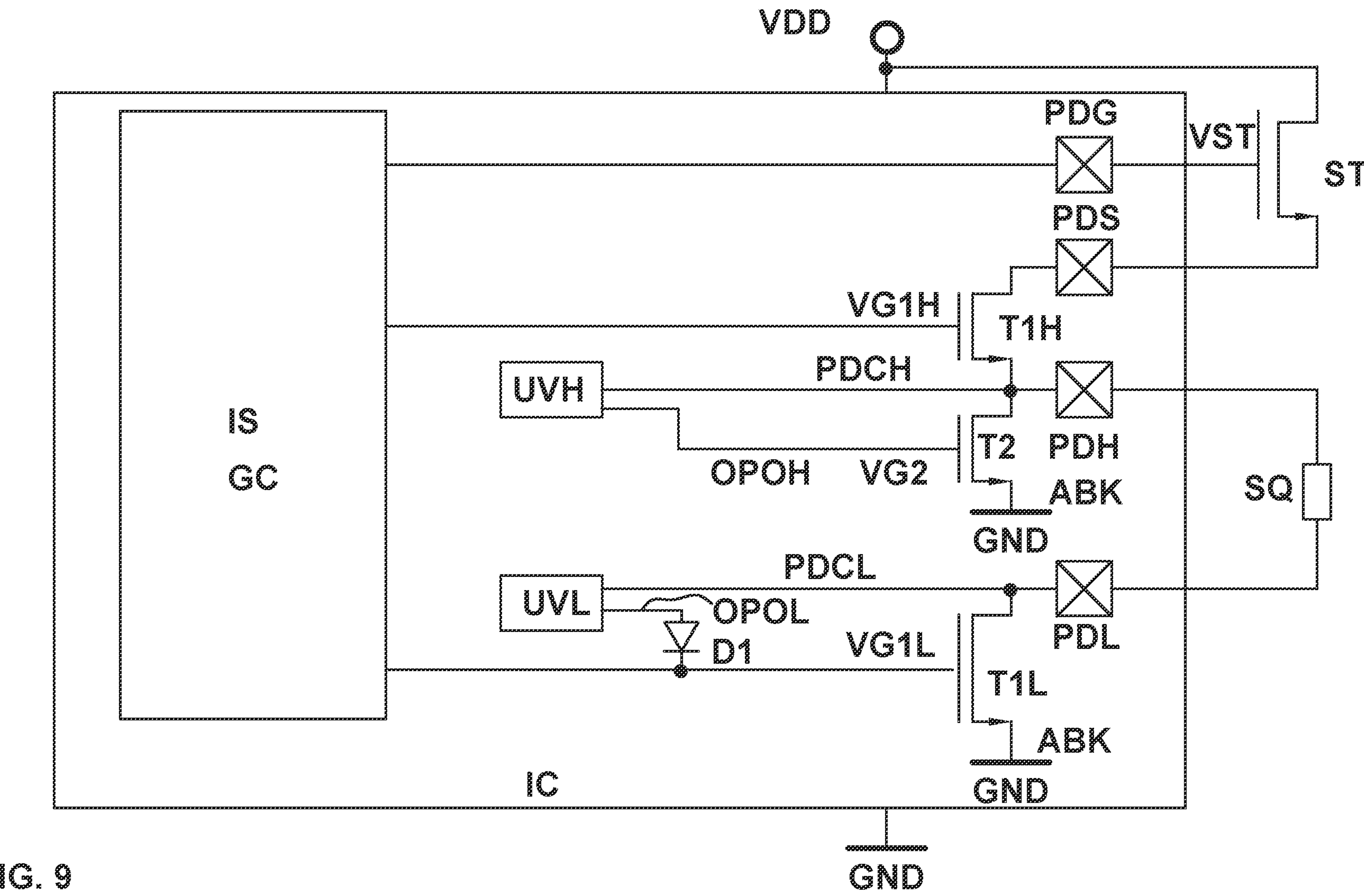

FIG. 9 shows the exemplary airbag system of FIG. 2, which according to the disclosure is now supplemented by a first monitoring circuit UVH (according to one of FIGS. 3 to 5) for the contact PDH of the high-side output transistor T1H and a second monitoring circuit UVL (according to one of FIGS. 6, 6*a*, 7 and 8) for the contact PDL for the low-side output transistor T1L. An explosive charge SQ is typically connected between these two contacts via lines laid in the vehicle, said lines being longer in some circumstances.

The first monitoring circuit UVH monitors the potential of the contact PDH of the high-side output transistor T1H.

The second monitoring circuit UVL monitors the potential of the contact PDL of the low-side output transistor T1L.

Furthermore, for the neutralization of a fault current at the contact PDH on the high-side output transistor T1H, said switching transistor T2 is namely provided, which pulls the contact PDH in the direction of the reference potential of the reference potential line GND in the event of a fault. The switching transistor T2 is controlled by the first monitoring circuit UVH. In relation to the first monitoring circuit UVH, the high-side output transistor T1H and the switching transistor T2, the situation corresponds to that of the circuit in FIG. 3.

A fault current at the contact PDL on the low-side output transistor T1L is neutralized via this low-side output transistor T1L itself, such that no separate switching transistor is required here, but can nonetheless be provided (as the example in FIG. 6*a* shows). The second monitoring circuit UVL switches on the low-side output transistor T1L in the event of a fault. In the event of a fault, the low-side output transistor T1L then pulls the potential of the contact PDL for the low-side output transistor T1L in the direction of the reference potential of the reference potential line GND. In relation to the second monitoring circuit UVL and the low-side output transistor T1H, the situation in FIG. 9 corresponds to that in FIG. 6.

Figure 10:
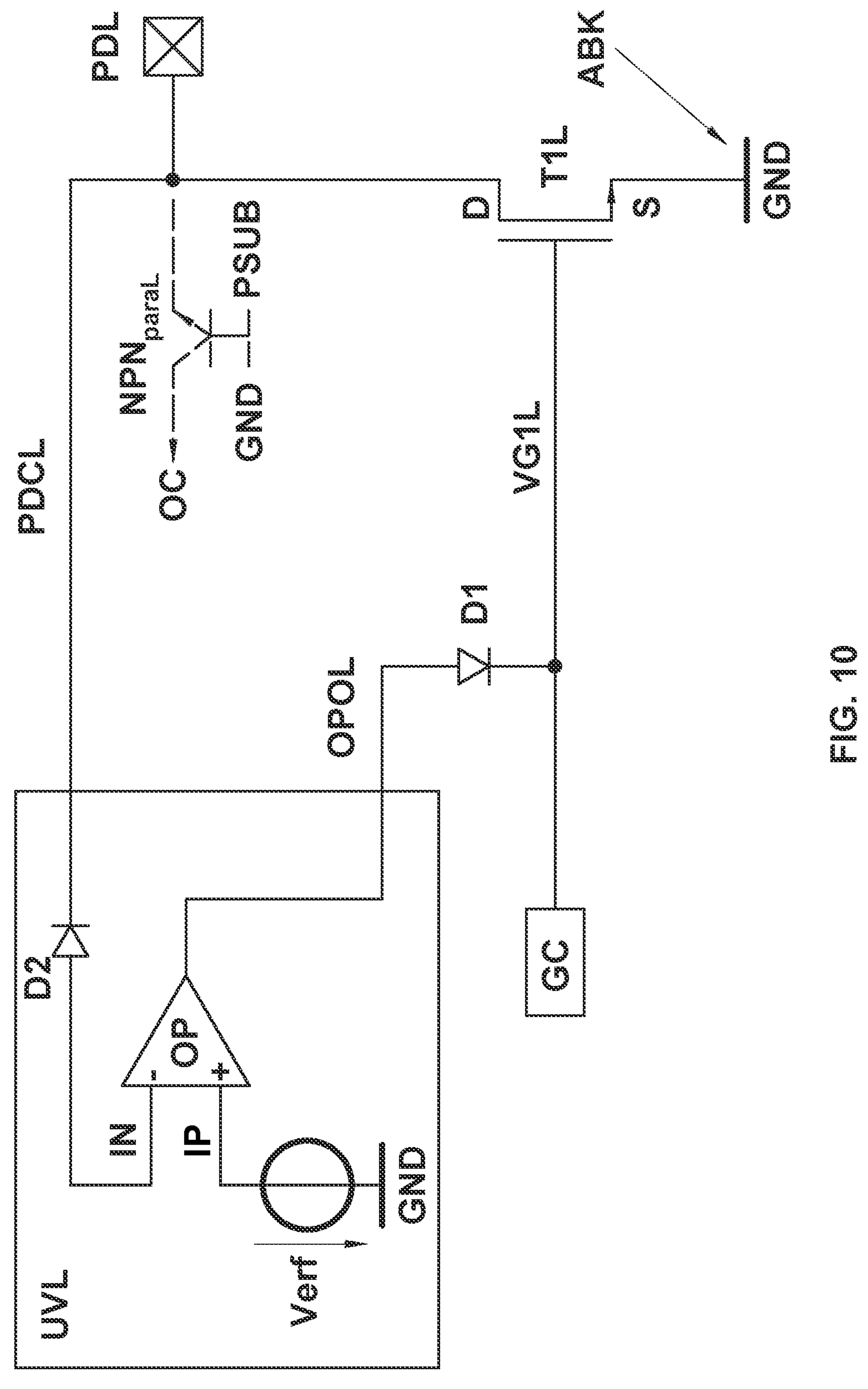

FIG. 10 shows an exemplary implementation of the second monitoring circuit UVL for the contact connected to the low-side output transistor T1L. With its negative input IN, an operational amplifier OP detects the potential of the low-side connection line PDCL, which is electrically connected to the contact PDL for the low-side output transistor T1L, via a (second) diode D2. The positive input IP of the operational amplifier OP is connected to a reference potential source Vref. If the potential of the low-side connection line PDCL plus the threshold voltage of the second diode D2 falls below the reference potential Vref, the operational amplifier OP connects through and recharges the control signal line for the control electrode of the low-side output transistor T1L via the diode D1 such that the low-side output transistor T1L connects through and electrically connects the contact PDL to the reference potential line GND with low resistance, so that the low-side output transistor T1L can supply a large part of the current drawn from the contact PDL as a result of the fault event from the reference potential line GND and so the potential of the contact PDL pulls so far in the direction of the reference potential of the reference potential line GND, at least for a time sufficient for the ignition of the other airbags, that other ignition circuits of the integrated circuit remain functional. In this case, the operational amplifier OP overwrites the output signals of the functional circuit GC and an ESD protection circuit that may be present, e.g., as a result of a sufficiently high current delivery capability of said operational amplifier's output drivers.

Figure 11:
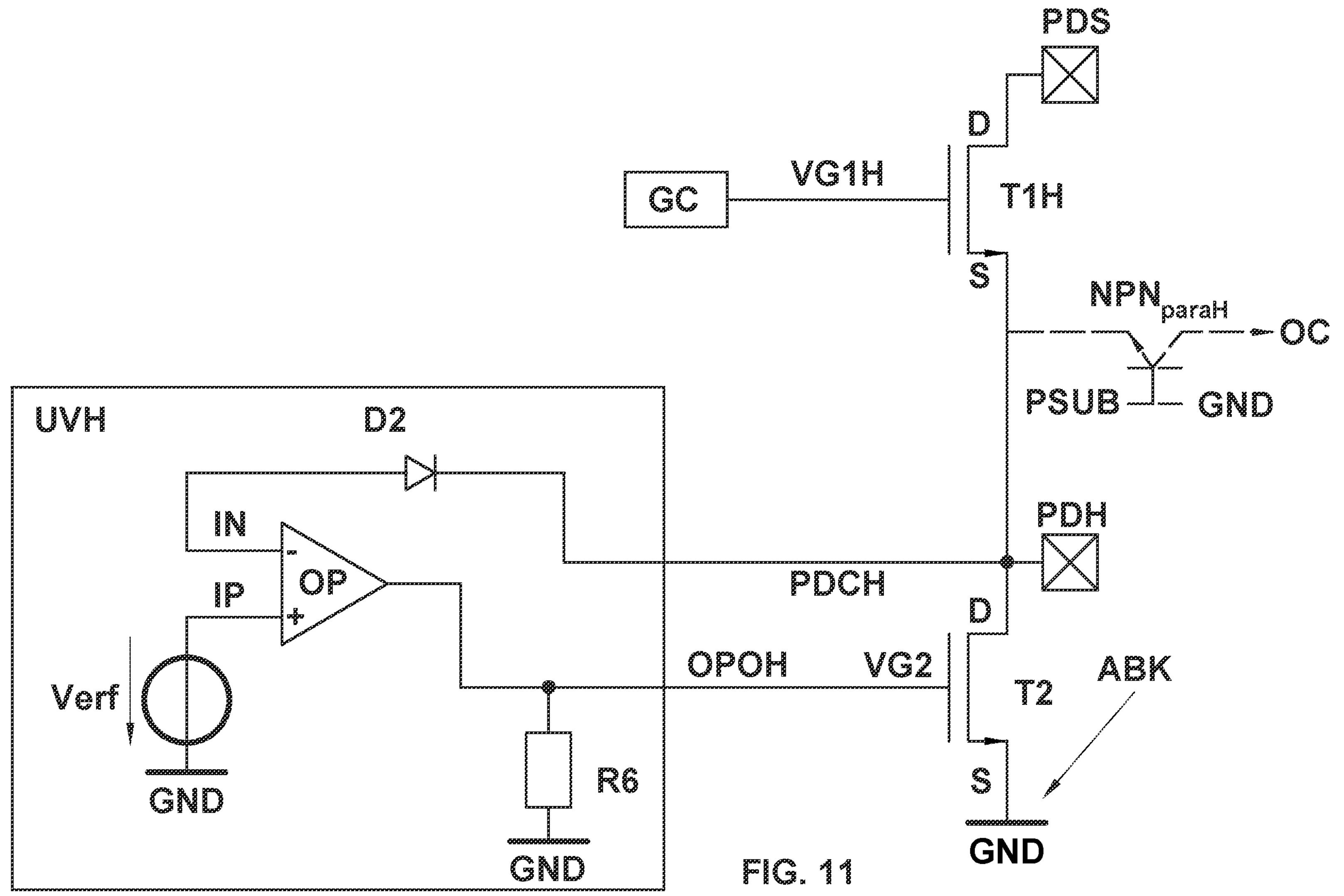

FIG. 11 shows an exemplary implementation of the first monitoring circuit UVH for the contact PDH for the high-side output transistor T1H. With its negative input IN, the operational amplifier OP detects the potential on the internal high-side connection line PDCH, which is electrically connected to the contact PDH for the high-side output transistor T1H, again via a (second) diode D2. The positive input IP of the operational amplifier OP is connected to a reference potential source Vref. If the potential of the high-side connection line PDCH plus the threshold voltage of the second diode D2 falls below the reference potential Vref, the operational amplifier OP connects through and recharges the control signal line VG2 for the control electrode of the additional switching transistor T2 so that the switching transistor T2 connects the contact PDH to the reference potential line with low electrical resistance, so that the high-side output transistor T1L can supply a large part of the current drawn from the contact PDH as a result of the fault event from the reference potential line GND and so the potential of the contact PDH pulls in the direction of the reference potential of the reference potential line GND, at least for a time sufficient for the ignition of other airbags, that other ignition circuits of the integrated circuit remain functional. In this case, the operational amplifier OP overwrites the output signals of the functional circuit GC and an ESD protection circuit, if present, due to a sufficiently strong current supply capability of said operational amplifier's output drivers, and actuates the switching transistor T2 via VG2. The pull-down resistor R6 can be provided as an option.

Figure 12:
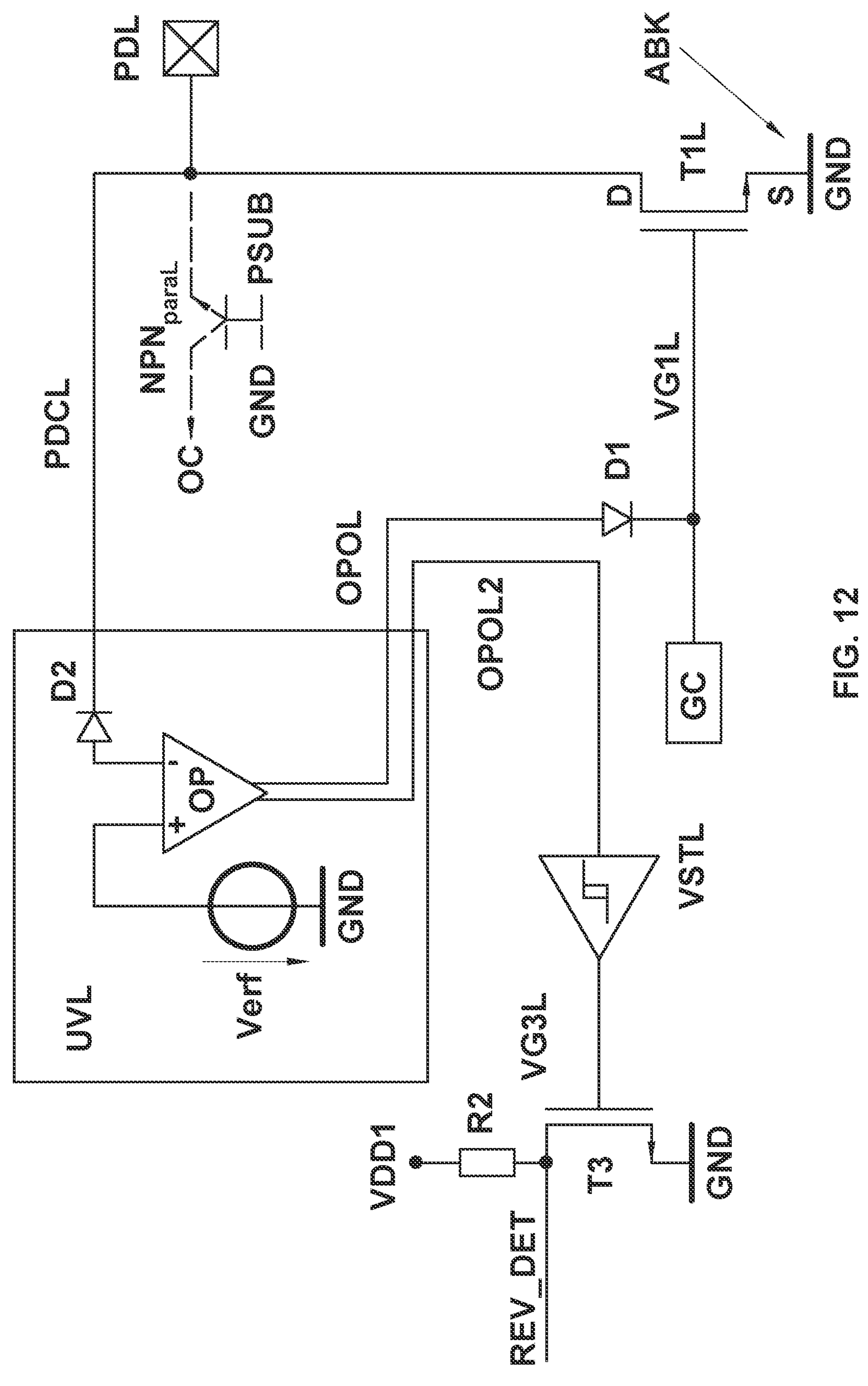

The circuit of FIG. 12 largely corresponds to that of FIG. 10. The difference between FIG. 10 and FIG. 12 corresponds to the difference between the circuits of FIGS. 6 and 7. Reference is made to the description of the signaling above.

According to FIG. 12, the output OPOL2 of the operational amplifier OP (the output OPOL2 can be identical to the output OPOL) is used to signal the fact that the potential at the output terminal contact PDL has reached or undershot the reference value.

Figure 13:
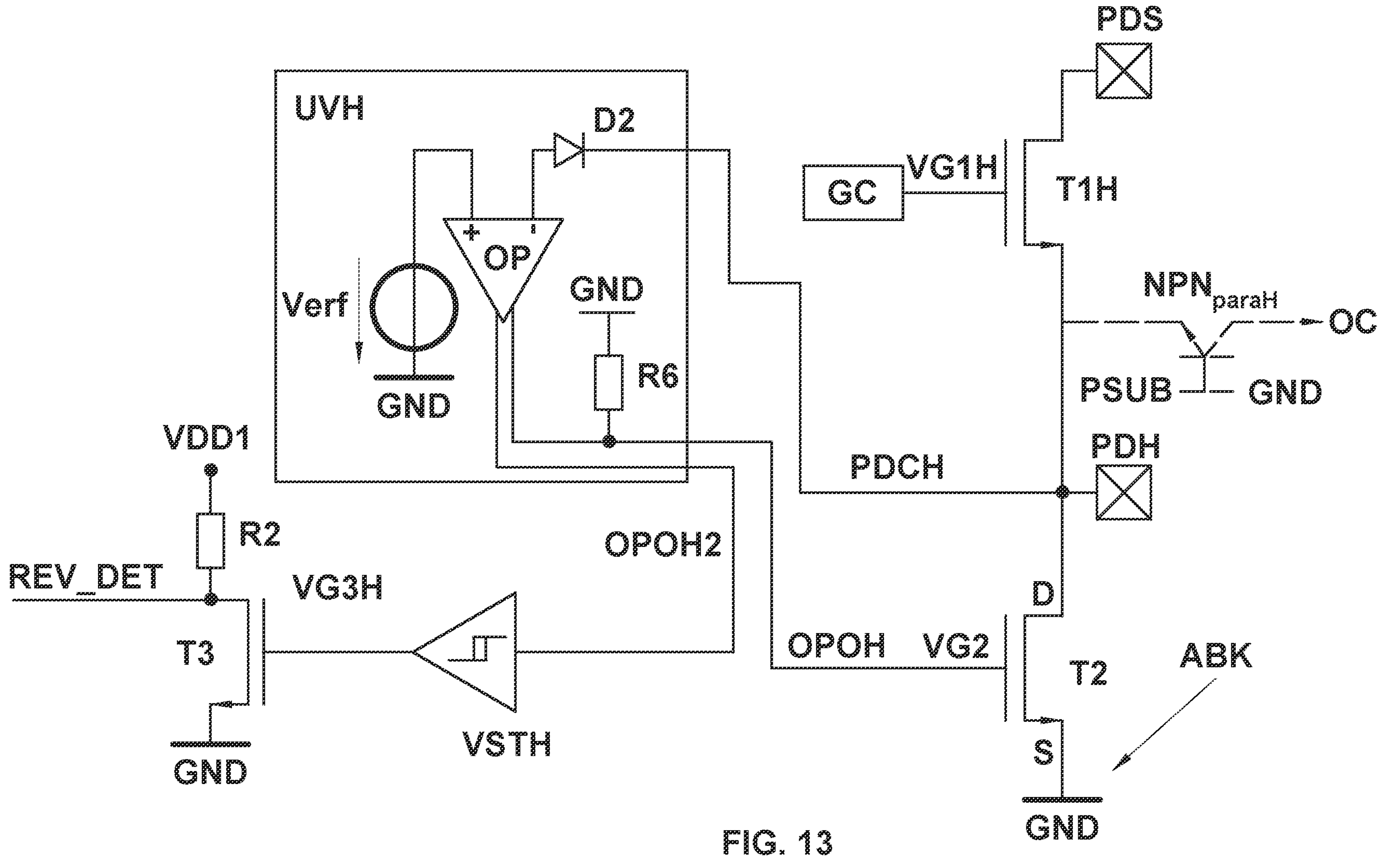

The circuit of FIG. 13 largely corresponds to that of FIG. 11. The difference between FIG. 11 and FIG. 13 corresponds to the difference between the circuits of FIGS. 3 and 4. Reference is made to the description of the signaling above. According to FIG. 13, the output OPOH2 of the operational amplifier OP (the output OPOH2 can be identical to the output OPOH) is used to signal the fact that the potential at the output terminal contact PDH has reached or undershot the reference value.

Figure 14:
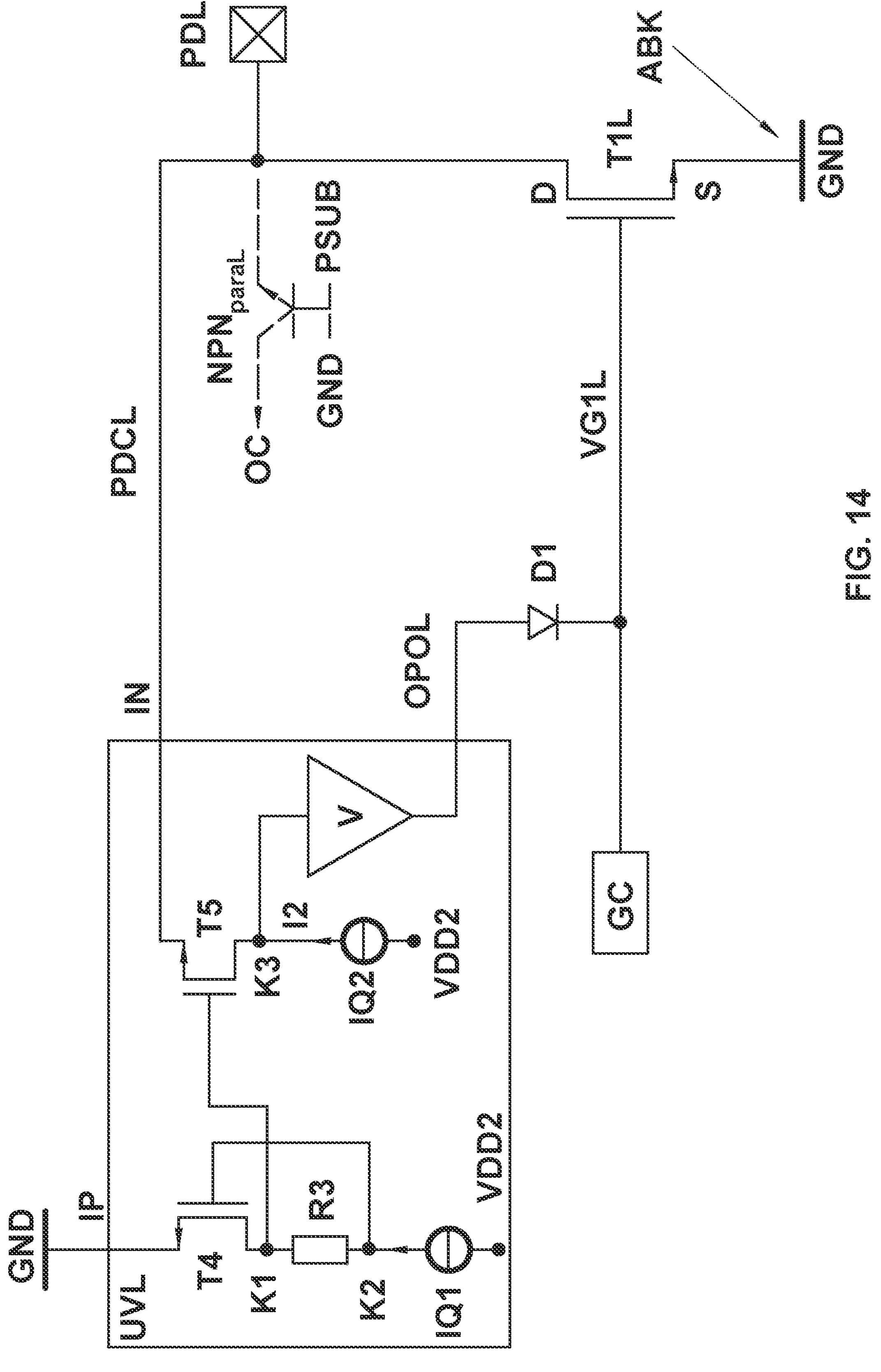

FIG. 14 shows a specific implementation of the second monitoring circuit UVL and relates primarily to a first possibility of generating the reference potential that is below that of the substrate or below the reference potential, which is usually ground. This means that the reference potential is 0 or negative. The first current source IQ1 feeds a (first) current I1 into the first node K1. The first current I1 flows through the (third) resistor R3 and causes a voltage drop there between the first node K1 and the second node K2. The (fourth) transistor T4 operates as a "detuned" MOS diode, which is caused by the additional voltage drop across the resistor R3. The (fifth) transistor T5 operates as a current source, wherein the current through the transistor T5 depends on its gate-source voltage and thus on the potential at the contact PDL connected to the low-side output transistor T1L. The current drawn from the node K3 by the transistor T5 works against the (second) current I2, which a second current source IQ2 feeds into a third node K3. If the potential of the contact PDL falls too far, the current through the transistor T5 becomes greater than the current I2 of the second current source IQ2. The potential of the third node K3 then falls, which then leads to an increase in potential of the control signal OPOL of the second monitoring circuit UVL through an amplifier V having negative gain and thus to a switching on of the low-side output transistor T1L via the diode D1, which in turn raises the potential of the contact PDL for the low-side output transistor T1L and thus the potential of the third node K3 again, until equilibrium is restored. The potential at the contact PDL only drops further when the current delivery capacity of the low-side output transistor T1L is exceeded by the fault current at the contact PDL. This measure can be combined with those of the circuits according to FIG. 16 and/or FIG. 17 and/or FIG. 18 and/or FIG. 19. These measures can be applied in an analogous manner to modifications of the circuit of FIG. 15 described below.

Figure 15:
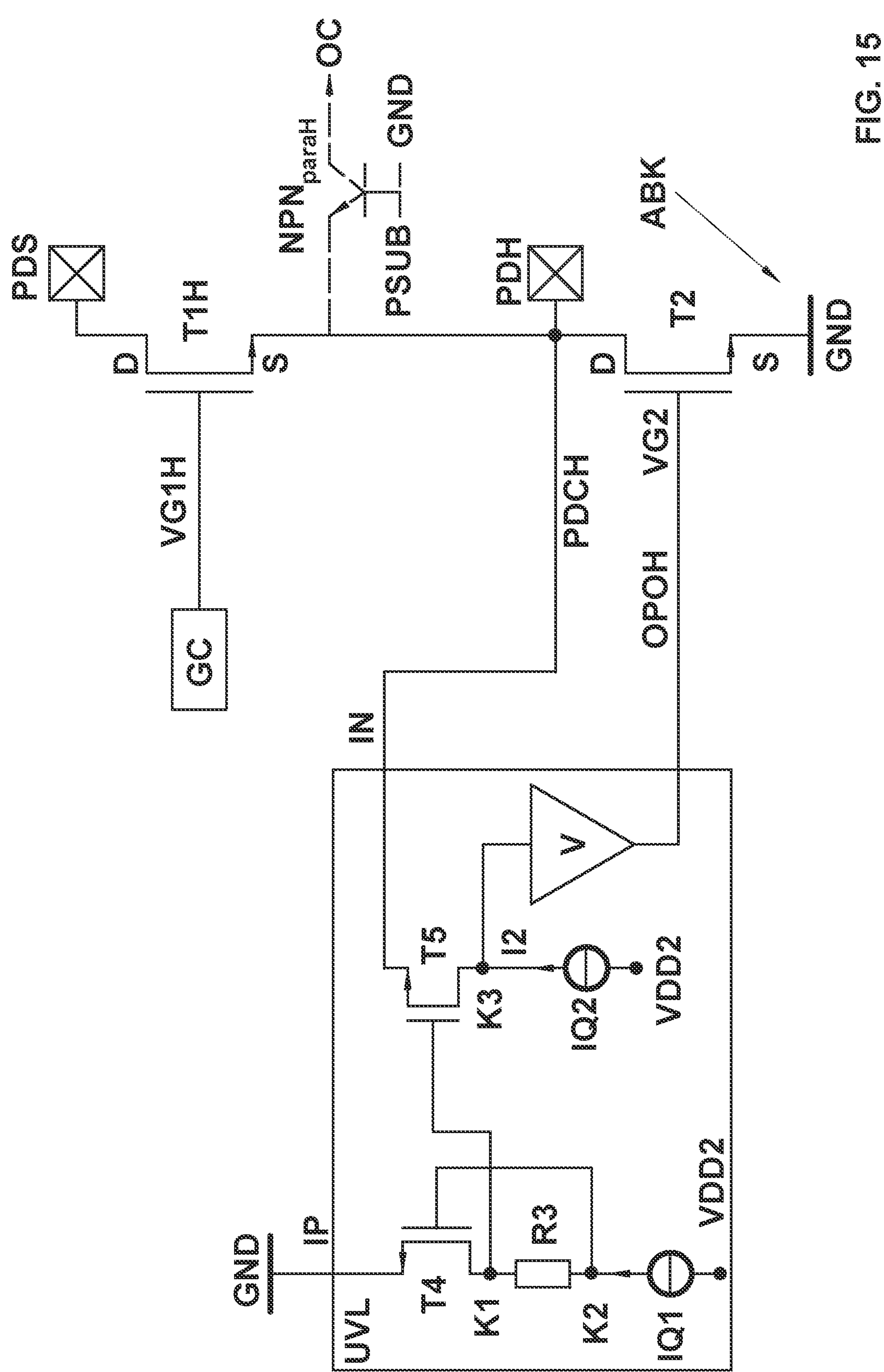

FIG. 15 shows a specific implementation of the first monitoring circuit UVH and relates primarily to a second possibility of generating the reference potential that is below that of the substrate or below the reference potential, which is usually ground. This means that the reference potential is 0 or negative. As can easily be seen, the monitoring circuit UVH does not differ from the implementation of the monitoring circuit UVL in FIG. 14. The first current source IQ1 feeds a (first) current I1 into the (first) node K1. The first current I1 flows through the (third) resistor R3 and causes a voltage drop there between the (first) node K1 and the (second) node K2. The (fourth) transistor T4 operates as a "detuned" MOS diode, which is caused by the additional voltage drop across the third resistor R3. The (fifth) transistor T5 operates as a current source, wherein the current through the transistor T5 depends on its gate-source voltage and thus on the potential at the contact PDH for the high-side output transistor T1H. The current drawn from the third node K3 by the transistor T5 works against the second current I2, which a (second) current source IQ2 feeds into the node K3. If the potential of the contact PDH connected to the high-side output transistor T1H falls too far, the current through the transistor T5 becomes greater than the current I2 of the current source IQ2. The potential of the node K3 then falls, which then leads to an increase in potential of the control signal OPOH of the first monitoring circuit UVH through an amplifier V having negative gain and thus to a switching on of the control transistor T2, which in turn raises the potential of contact PDH for the high-side output transistor T1H and thus the potential of node K3 again until equilibrium is restored. The potential at the contact PDH for the high-side output transistor T1H only drops further when the current delivery capacity of the control transistor T2 is exceeded by the fault current at the contact PDH for the high-side output transistor T1H.

Figure 16:
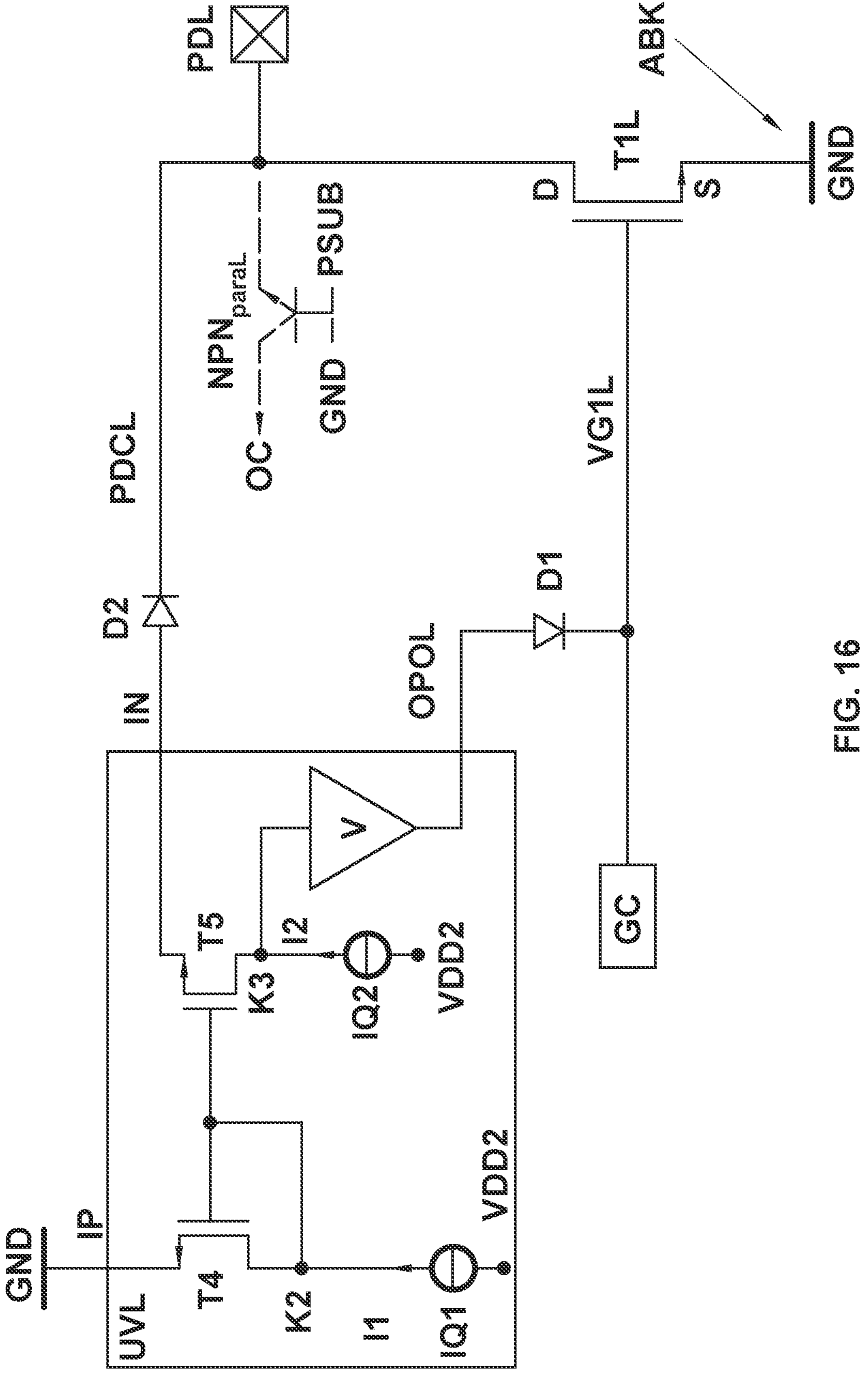

The circuit according to FIG. 16 corresponds to that of FIG. 14. In contrast to the circuit according to FIG. 14, the resistor R3 is omitted. The diode D2 is inserted between the negative output IN and the low-side connection line PDCL, the diode being able to be formed as a, e.g., bipolar diode or a Schottky diode. In that case, the low-side output transistor T1L begins to conduct when the potential of the contact PDL is below the reference potential of the reference potential line GND by the amount that corresponds to the threshold voltage of the second diode D2. This measure can be combined with those of the circuit according to FIG. 15 and/or FIG. 17 and/or FIG. 18 and/or FIGS. 19 and/or 20. These measures can be applied in an analogous manner to modifications of the circuit according to FIG. 15.

Figure 17:
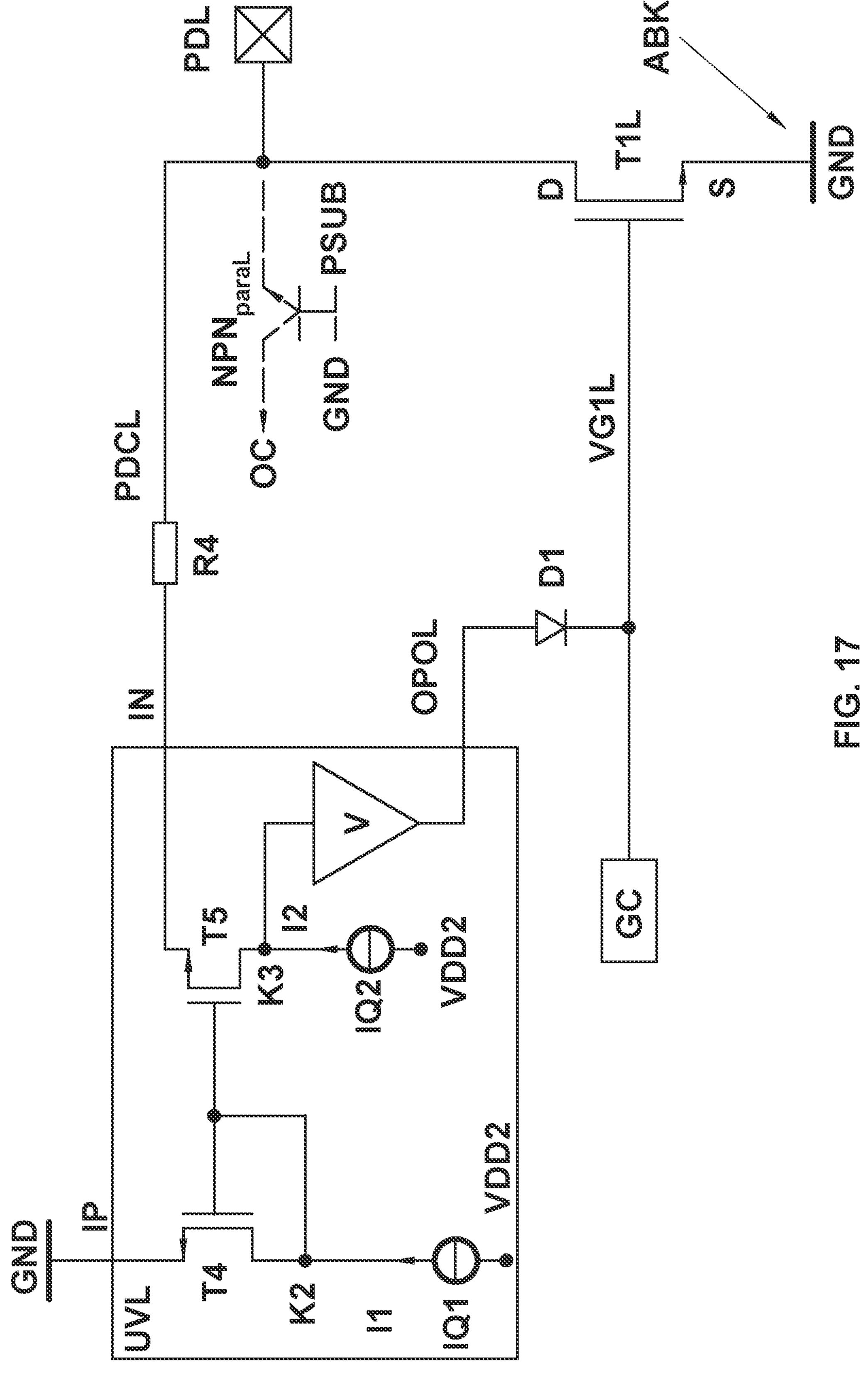

The circuit according to FIG. 17 corresponds to that of FIG. 14. In contrast to the circuit according to FIG. 14, the resistor R3 is omitted. A (fourth) resistor R4 is inserted between the negative output IN and the low-side connection line PDCL. In this case, the low-side output transistor T1L begins to conduct when the potential of the contact PDL is below the reference potential of the reference potential line GND by the amount of the product of the amount of the second current I1 times the value of the resistor R4. This measure can be combined with those of the circuit according to FIG. 14 and/or FIG. 18 and/or FIG. 19 and/or FIG. 20. These measures can be applied to modifications of FIG. 15 in an analogous manner.

Figure 18:
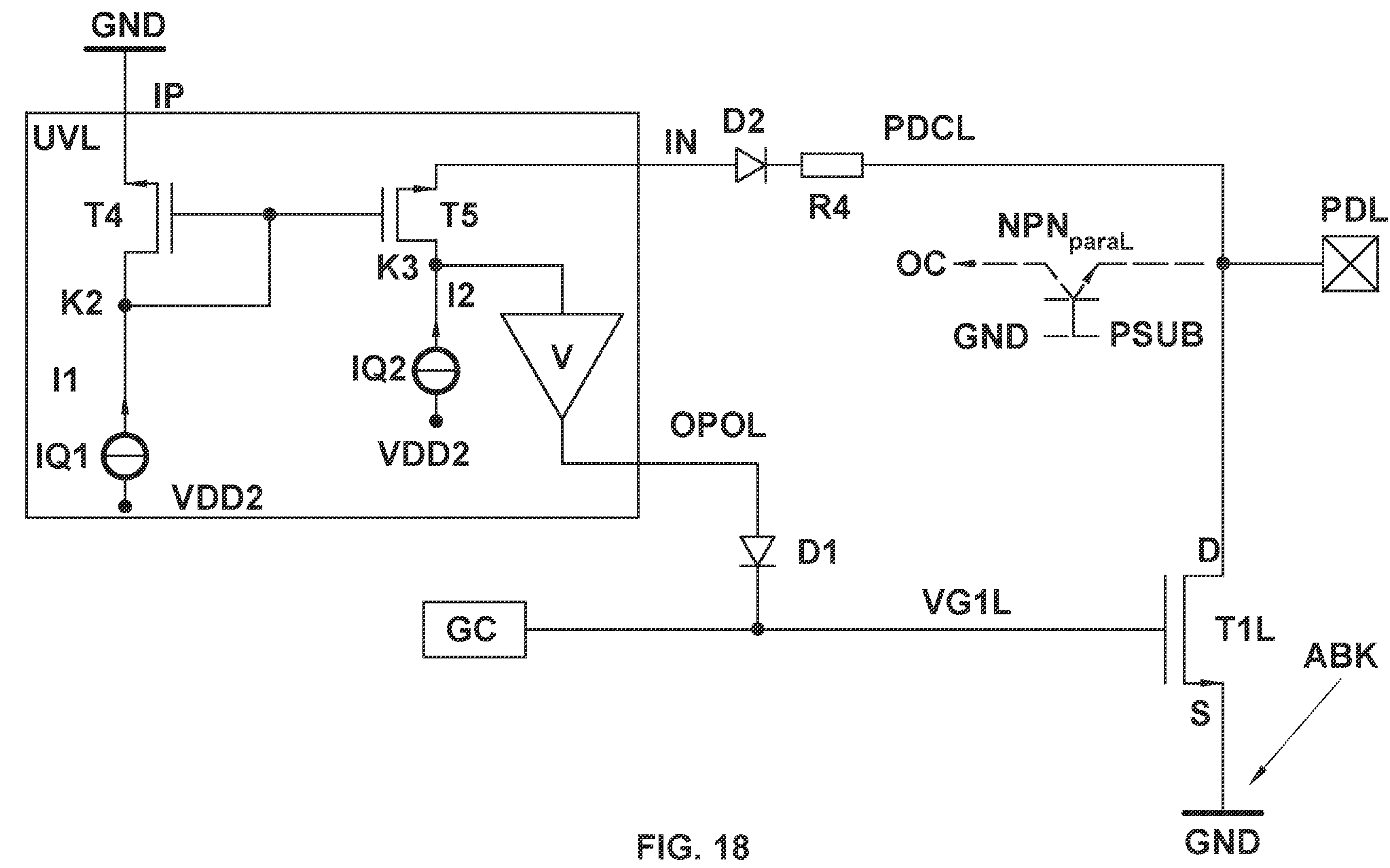

FIG. 18 shows a possible implementation of the second monitoring circuit UVL, wherein a series connection of a (fourth) resistor R4 and the diode D2 is provided at the negative output IN, compared to the second monitoring circuit UVL of the circuit according to FIG. 14.

The circuit of FIG. 18 corresponds to that of FIG. 14. In contrast to the circuit according to FIG. 14, the series connection made up of the resistor R4 and the diode D2 is inserted between the negative output IN and the low-side output transistor T1L. In this case, the low-side output transistor T1L begins to conduct when the potential of the contact PDL is below the reference potential of the reference potential line GND by the amount of the product of the magnitude of the second current I1 times the value of the resistor R4 plus the threshold voltage of the diode D2. These measures can be applied in an analogous manner to modifications of the circuit according to FIG. 15.

FIGS. 14 to 18 show various implementation options for setting and specifying the reference voltage below which the measure according to the disclosure for preventing the injection of substrate currents takes effect. As an alternative to, e.g., FIGS. 14 and 15 and 16 and 17, the different reference voltages can also be implemented by transistors T4 and T5 having different threshold voltages or having different current densities, i.e., gate electrodes of different magnitudes and correspondingly channels of different magnitudes. The currents I1 and I2 can also be of different magnitudes. In this respect, it should be noted that the disclosure is not limited to the circuits shown in the aforementioned figures. All of these variants are shown in FIG. 19, the circuit for which, e.g., the monitoring circuit UVL (but also similarly for the monitoring circuit UVH) has a current mirror with the two current sources IQ1, IQ2 and the two transistors T4, T5, wherein the input of the amplifier V, which has a negative gain, is connected to the connection of the second current source IQ2 to the transistor T5. The reference potential GND is present at the IP terminal, while the IN terminal is connected to the PDL contact to be monitored. The application of this circuit according to FIG. 19 for the implementation of the monitoring circuit UVH is possibly identical.

FIG. 20 shows an implementation for the monitoring circuit UVL or UVH with an operational amplifier OP with the output OPOH or OPOL and a negative and a positive input. A circuit node of a different one of two voltage dividers SPT1, SPT2 is connected to both inputs. The two resistors SPTR1 and SPTR2 of the voltage divider SPT1 are connected between a supply potential VDD and the reference potential GND, while the resistors SPTR3 and SPTR4 of the voltage divider SPT2 are connected between the supply potential VDD and the node PDH or PDL to be monitored.

FIG. 21 shows a further example of the monitoring circuit, in which a low-side output transistor T2L is part of the second monitoring circuit UVL because said low-side output transistor's gate-source path detects the potential of the contact GEN_I/O PDL.

FIG. 21 shows an alternative implementation of a monitoring circuit UVL2 in the form of a discharge circuit, which can be used to monitor an undershooting potential at an external terminal of an IC that is critical in the above sense. For the sake of simplicity, the actuation circuit for the control signal line VG2L for the control electrode of a low-side output transistor T2L for implementing the normal function is not shown, such that the essential parts of the transmission device UVL2 and their function are clear. A special feature of the circuit according to FIG. 21 is that the low-side output transistor T2L can in turn be part of the monitoring circuit UVL2. The low-side output transistor T2L detects the potential difference between its gate potential in the form of the potential of the control signal line VG2L for its control electrode on the one hand and the potential of the contact GEN_I/O on the other hand. The low-side output transistor T2L opens when the potential of the contact GEN_I/O is below the potential of the control signal line VG2L and the potential of the reference potential line GND and when this potential difference is sufficient to exceed the switching threshold of the low-side output transistor T2L.

If the potential of the contact GEN_I/O moves below the reference potential of the reference potential line GND, the parasitic NPN transistor $NPN_{paraL2}$ becomes conductive. Without countermeasures, this low potential of the contact GEN_I/O can interfere with other circuit parts of the integrated CMOS circuit that are arranged adjacent in the substrate and may be sensitive.

The parasitic NPN transistor $NPN_{paraL2}$ is specifically formed here by way of example in that the low-side output transistor T2L has an n-well which is electrically connected to the GEN_I/O contact and is in direct contact with the p-doped substrate Sub of the CMOS circuit. In the event of a fault, this n-well operates as the emitter of the parasitic NPN transistor $NPN_{paraL2}$. The substrate Sub is typically p-doped and is preferably connected to the reference potential line GND or preferably has a potential below the potential of the reference potential line GND.

The collector is an n-well in the vicinity of the low-side connection transistor T2L of any other circuit part of the integrated CMOS circuit. It can be, e.g., a transconductance amplifier OTA of a high-volt regulator, which has a high-volt NMOS transistor in an n-well of this type at its output.

In the event of a sufficiently negative voltage at the GEN_I/O contact, e.g., as a result of an accidental short circuit in the line connected to this contact and routed in the vehicle, without the circuit shown here, the output current of this OTA would be influenced by a short circuit between the n-well of the output transistor of the OTA and the n-well of the low-side output transistor T2L, so that the regulator might be disturbed or fail completely.

In the case described above, the discharge of the GEN_I/O contact has two functions:

a. discharging the parasitic capacitance at the GEN_I/O contact and
b. protection against the injected current, such that it is not injected as a sub-starting current into the substrate Sub and connects through the parasitic transistor $NPN_{paraL2}$ as a base-emitter current.

Any type of ESD protection for the low-side output transistor T2L can be provided.

The (fourth) node K4 is connected via the (fifth) resistor R5 to the output OPOL, which controls the low-side output transistor T1L. The transistor pair consisting of the (sixth) transistor T6 and low-side output transistor T2L then operates as a current mirror for the (third) current I3 of the (third) current source IQ3, which can then determine the current through the squib SQ, wherein the node K4, however, is now raised with respect to the output OPOL by a voltage which corresponds to the product of the value of the third current I3 and the value of the fifth resistor R5.

The current mirror is also used as a discharge circuit that discharges the load at the GEN_I/O contact, i.e., absorbing the additionally injected current directly at this contact.

In normal operation, the low-side output transistor T2L should always be blocked. For this purpose, the voltage between the reference potential of the reference potential line GND and the output OPOL must be lower than the threshold voltage VTH. This is achieved by the current source IQ3 injecting the current I3 into the fourth node K4, from where said fourth node creates a voltage drop across resistor R5. The gate-source voltage $V_{G\_T2L}$ of the low-side output transistor T2L between the output signal OPOL2 and the reference potential of the reference potential line is then:

$$V_{G\_T1L}=V_{TH\_T6}-I3xR5$$

Since the threshold voltage $V_{TH\_T6}$ is approximately equal to the threshold voltage $V_{TH\_T2L}$ of the low-side output transistor T2L, it is always ensured that the low-side output transistor T2L is blocked when said low-side output transistor should be blocked in the undisturbed case (normal operation).

In the event of a fault, however, when the potential of the contact GEN_I/O is below the reference potential of the reference potential line GND, the low-side output transistor T2L becomes conductive. In this case, the drain contact and source contact of the low-side output transistor T2L change roles. The conductivity of the low-side output transistor T2L is then determined by the voltage between the output OPOL2 and the contact GEN_I/O. If the magnitude of the third current I3 is selected correctly, the low-side output transistor T2L then becomes conductive and connects the reference potential line GND to the contact GEN_I/O. Since it then supplies the current drawn at this contact, it prevents the activation of the parasitic NPN transistor $NPN_{paraL2}$.

Since the OPOL2 output is biased, a small negative voltage at the GEN_I/O contact compared to the reference potential line GND is sufficient to operate the low-side output transistor T2L in the above reverse case (drain and source contacts are swapped).

This reliably prevents activation of the parasitic NPN transistor $NPN_{paraL2}$.

For an activation of this type of the parasitic NPN transistor $NPN_{paraL2}$, a voltage of 0.7 V is typically required between the substrate Sub and contact GEN_I/O. If the switching threshold is −300 mV for I3xR5, then the low-side output transistor T2L is switched on at −300 mV compared to the reference potential line GND at the contact GEN_I/O. The voltage of −300 mV at the GEN_I/O contact compared to the reference potential line GND is not sufficient to trigger the parasitic NPN transistor $NPN_{paraL2}$, since the threshold voltage of the base-emitter diode of the parasitic NPN transistor $NPN_{paraL2}$ requires a higher absolute value voltage.

In the circuit according to FIG. 21, therefore, the control electrode of the transistor T2L is electrically "biased" such that this transistor T2L conducts as soon as a potential equal to or below the reference potential is present at its drain terminal. A corresponding "suitable" potential is present at the source terminal of the transistor T2L, which is electrically connected to the leakage circuit node ABK.

The circuit according to FIG. 21 can be used as a further alternative for both the monitoring circuit UVH and the monitoring circuit UVL, wherein a dedicated switching transistor T2L is used in each case, which, based on, e.g., an output driver stage with high-side transistor and low-side transistor, is arranged between their connections that are led to the outside and the potentials of which are to be monitored and a common or a separate leakage circuit node.

The disclosure has at least one or some of the feature groups mentioned below or one or some of the features of one or more of the feature groups mentioned below:

Feature 1. A device for use in a CMOS integrated circuit
having a contact PDH, PDL of the CMOS circuit and
having a p-doped substrate Sub of the CMOS circuit and
having an n-doped N-region NG and
having an output line PDCH, PDCL and
having an output transistor T1H, T1L and
having a functional circuit GC and
having an optional ESD protection circuit and
having a reference potential line GND,
the N-region NG lying in the p-doped substrate Sub and
the N-region NG being electrically connected to the output line PDCH, PDCL and
the contact PDH/PDL being electrically connected to the output line PDCH, PDCL and
the optional ESD protection circuit being able to switch on the output transistor T1H, T1L and
the functional circuit GC being able to switch on and off the output transistor T1H, T1L and
the device comprising a switching transistor T2, T1L and
the device comprising a monitoring circuit UVH, UVL and
the monitoring circuit UVH, UVL detecting the potential of the contact PDH, PDL or a potential derived therefrom and
the monitoring circuit UVH, UVL comparing the detected value of the potential of the contact PDH, PDL and/or the detected value of the potential derived from the potential of the contact PDH, PDL with a reference value and
the monitoring circuit UVH, UVL switching on a switching transistor T2, T1L,
if the value of the potential of the contact PDH, PDL is below the reference value, and
this reference value for the value of the potential of the contact PDH, PDL being lower than the value of the potential of the substrate Sub and/or lower than the value of the potential of the reference potential line GND and
the switching transistor T2, T1L connecting the contact PDH, PDL to a reference potential line GND when said switching transistor is switched on,
the switching transistor T1L being able to be equal to the output transistor T1L.

Feature 2. The device according to feature 1,
wherein an output of the monitoring circuit UVH, UVL is used to generate a signaling for a current drain at the contact PDH, PDL,
wherein this signaling indicates that the switching transistor T2, T1L is switched or was switched on by the monitoring circuit UVH, UVL.

Feature 3. The monitoring circuit for a device according to features 1 or 2
having a differential amplifier OP and
having a reference voltage source Vref and
wherein the operational amplifier OP detects the potential of the contact PDH, PDL directly or indirectly via a first diode D1 with its negative input IN and
wherein the operational amplifier OP detects the potential of the reference voltage source Vref with its positive input IP and
wherein the operational amplifier OP can switch on the switching transistor T2, T1L directly or indirectly via a second diode D2 by means of its output OPOH, OPOL.

Feature 4. The monitoring circuit according to feature 3, wherein the reference voltage of the reference voltage source Vref is chosen such that the operational amplifier OP switches on the switching transistor T2, T1L by means of its output OPOH, OPOL when the value of the potential of the contact PDH, PDL is below the value of the potential of the substrate Sub and/or is below the value of the potential of the reference potential line GND.

Feature 5. The monitoring circuit according to features 3 or 4,
wherein an output of the operational amplifier OP is used to generate a signaling for a current drain at the contact PDH, PDL,
wherein this signaling indicates that the switching transistor T2, T1L is or was switched on by the operational amplifier OP.

Feature 6. The monitoring circuit for a device according to features 1 or 2
having a fourth transistor T4 and
having a fifth transistor T5 and
having a third resistor R3 and
having a first current source IQ1 and
having a second power source IQ2 and
having a first node K1 and
having a second node K2 and having a third node K3,
having an amplifier V,
wherein the third resistor R3 has a first terminal and a second terminal and
wherein the fourth transistor T4 is connected with its source terminal to a reference potential GND and
wherein the fourth transistor is connected with its drain terminal to the second node K2 and
wherein the control electrode of the fourth transistor T4 is connected to the first node K1 and
wherein the first terminal of the third resistor R3 is connected to the first node K1 and
wherein the second terminal of the third resistor R3 is connected to the second node K2 and
wherein source terminal of the fifth transistor T5 is connected directly or indirectly, in particular via a first diode D1 and/or a fourth resistor R4, to a contact PDL and
wherein the control electrode of the fifth transistor T5 is connected to the second node K2 and
wherein the drain terminal of the fifth transistor T5 is connected to the third contact K3 and
wherein the amplifier V, depending on the potential of the third node K3, can switch on the switching transistor T2 or the low-side output transistor T1L by means of its output signal OPOH, OPOL and
wherein the first current source IQ1 injects a first current I1 into the first node K1 and
wherein the second current source IQ2 feeds a second current I2 into the third contact K3.

Features 7. The monitoring circuit (FIG. 16) for a device according to features 1 or 2
having a fourth transistor T4 and
having a fifth transistor T5 and
having a first current source IQ1 and
having a second power source IQ2 and
having a second node K2 and
having a third node K3,
having an amplifier V,
wherein the fourth transistor T4 is connected with its source terminal to a reference potential GND and
wherein the fourth transistor is connected with its drain terminal to the second node K2 and
wherein the control electrode of the fourth transistor T4 is connected to the second node K2 and
wherein source terminal of the fifth transistor T5 is connected directly or indirectly, in particular via a first diode D1 and/or a fourth resistor R4, to a contact PDL, PDH and
wherein the control electrode of the fifth transistor T5 is connected to the second node K2 and
wherein the drain terminal of the fifth transistor T5 is connected to the third contact K3 and
wherein the amplifier V, depending on the potential of the third node K3, can switch on the switching transistor T2 or the low-side output transistor T1L by means of its output signal OPOH, OPOL and
wherein the first current source IQ1 injects a first current I1 into the first node K1 and
wherein the second current source IQ2 feeds a second current I2 into the third contact K3.

Feature 8. An airbag firing stage
having a substrate Sub and
having a high-side output transistor T1H and
having a low-side output transistor T1L and
having an ignition element SQ and
the ignition element SQ being connected between the low-side output transistor T1L and the high-side output transistor T1H and
the ignition element SQ having a first connection and a second connection and
the airbag ignition stage comprising at least one monitoring circuit UVH, UVL and
the airbag ignition stage having means T1L, T2 to connect at least one terminal of the ignition element to a reference potential line GND and
these means T1L, T2 being able to be controlled by the monitoring circuit UVH, UVL and
the monitoring circuit UVH, UVL detecting the potential of this at least one terminal of the ignition element SQ and
the monitoring circuit UVH, UVL causing the means T1L, T2 to connect the at least one terminal of the ignition element to the reference potential line GND if the value of the detected potential of the at least one terminal PDH, PDL is below the value of the potential of the substrate Sub and/or is below the value of the potential of the reference potential line GND.

Feature 9. An airbag firing stage
having a substrate Sub and
having a high-side output transistor T1H and
having a low-side output transistor T1L and
having an ignition element SQ and
the ignition element SQ being connected between the low-side output transistor T1L and the high-side output transistor T1H and
the ignition element SQ having a first connection and a second connection and
the airbag ignition stage comprising a first monitoring circuit UVH and
the airbag ignition stage comprising a second monitoring circuit UVL and
the airbag ignition stage having first means T2 to connect at least the first terminal PDH of the ignition element to a reference potential line GND and
the airbag ignition stage having second means T1L to connect at least the second terminal PDL of the ignition element to a reference potential line GND and
the first means T2 being able to be controlled by the first monitoring circuit UVH and
the second means T1L being able to be controlled by the second monitoring circuit UVL and
the first monitoring circuit UVH detecting the first potential of the first terminal PDH of the ignition element SQ and
the second monitoring circuit UVL detecting the second potential of the second terminal PDL of the ignition element SQ and
the first monitoring circuit UVH causing the first means T2 to connect the first terminal PDH of the ignition element SQ to the reference potential line GND if the value of the detected first potential of the first terminal PDH is below the value of the potential of the substrate Sub and/or is below the value of the potential of the reference potential line GND and
the second monitoring circuit UVL causing the second means T1L to connect the second terminal PDL of the ignition element SQ to the reference potential line GND if the value of the detected second potential of the second terminal PDL is below the value of the potential of the substrate Sub and/or is below the value of the potential of the reference potential line GND.

Feature 10. A method for monitoring an airbag deployment stage having a substrate Sub and
having a high-side output transistor T1H and
having a low-side output transistor T1L and
having an ignition element SQ and
the ignition element SQ being connected between the low-side output transistor T1L and the high-side output transistor T1H and
the ignition element SQ having a first connection and a second connection and having the following steps during the operation of the airbag firing stage:
detecting the potential of at least one terminal of the ignition element SQ,
connecting the at least one terminal of the ignition element SQ to the reference potential line GND or another line with a potential higher than the potential of the reference potential line GND if the value of the detected potential of the at least one terminal of the ignition element SQ is below the value of the potential of the substrate Sub and/or is below the value of the potential of the reference potential line GND.

Feature 11. A method for preventing substrate current injection into the substrate Sub of a CMOS circuit having a contact PDH, PDL of the CMOS circuit and
having a reference potential line GND,
having the steps:
detecting the potential of the contact PDH, PDL;
comparing the value of the detected potential of the contact PDH, PDL with a reference value;
connecting the contact PDH, PDL to the reference potential line GND or another line with a potential higher than the potential of the reference potential line GND, if the value of the potential of the PDH, PDL contact is below a reference value, this reference value for the value of the potential of the contact PDH, PDL being below the value of the potential of the substrate Sub and/or being below the value of the potential of the reference potential line GND.

Feature 12. A switching stage (FIG. 20) for the low-side output transistor T1L of an airbag system having a contact PDL and
having a third current source IQ3 and
having a fifth resistor R5 and
having a sixth transistor T6 and
having a fourth node K4 and
having an output OPOL and
having a low-side connection line PDCL and
having a reference potential line GND,
the sixth transistor T6 having a first terminal and a second terminal and a control terminal and
the low-side output transistor T1L having a first terminal and a second terminal and a control terminal and
the third current source IQ3 feeding a third current I3 into the fourth node K4 and
the first terminal of the sixth transistor T6 being connected to the output OPOL and
the second terminal of the sixth transistor T6 being connected to the reference potential line GND and
the control terminal of the sixth transistor T6 being connected to the fourth node K4 and
the first terminal of the low-side output transistor T1L being connected to the low-side connection line PDCL and
the second terminal of the low-side output transistor T1L being connected to the reference potential line GND and
the control terminal of the low-side output transistor T1L being connected to the output OPOL.

LIST OF REFERENCE CHARACTERS

ABK leakage circuit node
B base
C1 collector
C2 collector
C3 collector
D1 first diode
D2 second diode
E emitter
EN switch-on signal
GC functional circuit that carries out the actual function of the CMOS circuit
GEN_I/O external terminal contact
GND reference potential line
I1 first current
I2 second current
I3 third current
IC integrated CMOS circuit
IN negative input of the operational amplifier OP
IP positive input of the operational amplifier OP
IQ1 first current source
IQ2 second current source
IQ3 third current source
IS internal circuit of the integrated circuit IC
K1 first node
K2 second node
K3 third node
K4 fourth node
NG N-region
NG1 N-region
NG2 N-region
NG3 N-region
NPN1 NPN transistor
NPN2 NPN transistor
NPN3 NPN transistor
$NPN_{para}$ parasitic NPN transistor
$NPN_{paraH}$ parasitic NPN transistor on external terminal contact PDH connected to high-side output transistor T1H
$NPN_{paraL}$ parasitic NPN transistor on the external terminal contact PDL connected to the low-side output transistor T1L
$NPN_{paraL2}$ parasitic NPN transistor on the external terminal contact GEN_I/O for the low-side output transistor T2L
OFF switch-off signal
OP operational amplifier
OPOH output of the operational amplifier OP or control signal of the first monitoring circuit UVH
OPOL output of the operational amplifier OP or control signal of the second monitoring circuit UVL
OPOL2 output of the operational amplifier OP or control signal of the second monitoring circuit UVL2
OPO2H second output signal for signaling a potential undershoot at the external terminal contact PDH connected to the high-side output transistor T1H
OPO2L second output signal for signaling a potential undershoot at the external terminal contact PDL connected to the low-side output transistor T1L
OS upper side of the substrate
PDCH IC-internal high-side connection line
PDCL IC-internal low-side connection line PDG external terminal contact of the IC to which the control electrode of the safety transistor ST is connected via an external line PDH external terminal contact (monitoring circuit node) of the IC to which the high-side output transistor T1H is connected and to which an explosive charge (squib) is connected via an external line PDL external terminal contact (monitoring circuit node) of the IC to which the low-side output transistor T1L is connected PDS external terminal contact of the IC to which the safety transistor ST is connected from the outside PSUB substrate potential R1 first resistor R2 second resistor R3 third resistor R4 fourth resistor R5 fifth resistor R6 sixth resistance REV_DET signaling line SPT1 first voltage divider SPT2 second voltage divider SPTR1 first resistor of the first voltage divider SPTR2 second resistor of the first voltage divider SPTR3 first resistor of the second voltage divider SPTR4 second resistor of the second voltage divider SQ squib (explosive charge) of a in particular passive vehicle occupant restraint system (such as belt tensioners) or a in particular passive vehicle safety device (such as airbag)

Sub substrate of the CMOS circuit

ST external safety transistor

T1H high-side output transistor

T1L low-side output transistor

T2L low-side output transistor

T2 switching transistor, which may or may not be identical to the output transistor T1L T3 signaling transistor T3H signaling transistor T3L signaling transistor T4 (fourth) transistor of a current mirror T5 (fifth) transistor of a current mirror T6 (sixth) transistor UVH first monitoring circuit for the external terminal contact PDH connected to the high-side output transistor T1H UVL second monitoring circuit for the external terminal contact PDL connected to the low-side output transistor T1L UVL2 monitoring circuit VDD supply potential VDD1 supply potential VDD2 supply potential VDD3 supply potential VG1H control signal line for the control electrode of the high-side output transistor T1H VG1L control signal line for the control electrode of the low-side output transistor T1L VG2L control signal line for the control electrode of the low-side output transistor T2L VG2 control signal line for the control electrode of switching transistor T2

VG3H control signal line for the control electrode of signaling transistor T3H VG3L control signal line for the control electrode of the signaling transistor T3L VST control signal line for the control electrode of the safety transistor ST VSTH Schmitt trigger VSTL Schmitt trigger Vref reference voltage source

What is claimed is:

1. A device for use in an integrated CMOS circuit, which is integrated in a semiconductor substrate doped with charge carriers of a first conductivity type, the semiconductor substrate comprising:

a plurality of regions doped with charge carriers of a second conductivity type that is opposite to the first conductivity type, which each form electronic components or in which electronic components are each formed, a monitoring circuit node, which lies in one of the doped regions or is electrically connected to one or more of the doped regions and is to be monitored with regard to its potential, the semiconductor substrate having a substrate potential applied thereto, the CMOS circuit having a reference potential and an output driver stage for actuating an activating element of a passive vehicle safety system, wherein the output driver stage has two external terminal contacts which are to be led out or which are led out and a high-side output transistor, as well as a low-side output transistor, each of which is connected to a different one of the two external contacts, wherein each of the external contacts is configured to connect to the actuating or activating element, and wherein the monitoring circuit node includes at least one of the two external contacts configured to be connected to the actuating or activating element, a parasitic bipolar lateral structure being formed, between the doped region having the monitoring circuit node and at least one doped region adjacent to this doped region or between at least one of the doped regions, to which the monitoring circuit node is electrically connected, and a doped region adjacent to this doped region or a doped region adjacent to one of these doped regions, further comprising:

an electronic switch having a conduction path which is electrically connected to both the monitoring circuit node and a leakage circuit node for discharging current from the monitoring circuit node, and having a control electrode for blocking and conducting switching of a line path, a monitoring circuit for the monitoring circuit node, the monitoring circuit detecting a potential value representing the potential at the monitoring circuit node, wherein the monitoring circuit has a comparator circuit which compares the detected potential value with a predetermined reference potential, wherein the predetermined reference potential is equal to or lower than the substrate potential, or equal to or lower than the reference potential, or equal to both the substrate potential and the reference potential, or lower than both the substrate potential and the reference potential, wherein the monitoring circuit directly or indirectly generates a switch-on signal for switching the electronic switch to conduction when the detected potential value is equal to the reference potential or is below the reference potential, and thus the generation of a substrate current in the bipolar lateral structure in the semiconductor substrate is suppressed, and wherein the electronic switch is the low-side output transistor of the output driver stage and the monitoring circuit node is the external terminal contact of the output driver stage which is connected to the low-side output transistor.

2. The device according to claim 1, wherein the monitoring circuit node is an external terminal contact which is led out or which is to be led out to an outside of the CMOS circuit or is electrically connected to an external terminal contact which is led out or which is to be led out to the outside of the CMOS circuit.

3. The device according to claim 1, wherein the monitoring circuit node is the output of a transistor of an output driver stage of the CMOS circuit.

4. The device according to claim 3, wherein the transistor of the output driver stage is a low-side transistor connected to the reference potential and that the electronic switch is arranged between the monitoring circuit node and the leakage circuit node.

5. The device according to claim 3, wherein the transistor of the output driver stage is a low-side transistor connected to the reference potential and in that the low-side transistor forms the electronic switch.

6. The device according to claim 3, wherein the transistor of the output driver stage is a high-side transistor of the output driver stage which is connected directly or indirectly to a supply potential and that the electronic switch is arranged between the monitoring circuit node of the high-side transistor and the leakage circuit node.

7. The device according to claim 1 wherein the monitoring circuit provides a status signal for signaling that the electronic switch is switched to conduction.

8. The device according to claim 7, wherein information about the generation of the status signal can be stored temporarily or permanently in a memory or the device includes a memory for a temporary or permanent storage of information about the generation of the status signal.

9. The device according to claim 1 wherein the CMOS circuit includes an actuatable electronic component electrically connected to the monitoring circuit node, such as a transistor, a thyristor or similar element, and an actuation circuit for actuating the component for an intended function of the component and further components that interact electrically with the component.

10. The device according to claim 1, wherein:

the comparator circuit comprises an operational amplifier including a positive input terminal and a negative input terminal and including an output terminal, the reference potential is provided by a reference voltage source, the negative input terminal of the operational amplifier is connected to the monitoring circuit node or is connected to same with an interposition of a diode having a cathode electrically connected to the monitoring circuit node and an anode electrically connected to the negative input terminal of the operational amplifier, and the output terminal of the operational amplifier is electrically connected to the control electrode of the electronic switch or connected to same with the interposition of a diode having a cathode electrically connected to the control electrode of the electronic switch and an anode electrically connected to the output terminal of the operational amplifier.

11. The device according to claim 10, wherein a pull-down resistor is electrically connected to the connection of the output terminal of the operational amplifier to the control electrode of the electronic switch, which is electrically connected to the reference potential.

12. The device according to claim 10, wherein the monitoring circuit provides a status signal for signaling that the electronic switch is switched to conduction, and wherein the operational amplifier generates the switch-on signal for switching the electronic switch to conduction at said operational amplifier's output terminal and outputs said switch-on signal at its control electrode if the detected potential value is equal to or below the reference potential, and that the operational amplifier outputs the status signal or that the switch-on signal is also used as a status signal.

13. The device according to claim 1, wherein:

a first transistor having a source terminal, a drain terminal and a control electrode, a second transistor having a source terminal, a drain terminal and a control electrode, a first current source for outputting a first current having an output terminal, a resistor, wherein the output terminal of the first current source is electrically connected to the resistor and same is electrically connected to the drain terminal of the first transistor, the source terminal of which is electrically connected to the reference potential, a second current source for outputting a second current having an output terminal which is electrically connected to the drain terminal of the second transistor, the source terminal of which is electrically connected to the monitoring circuit node or to same with an interposition of a series connection composed of a resistor and a diode having an anode and a cathode, wherein either the anode of diode is electrically connected to the source terminal of the second transistor and the cathode of diode is electrically connected to the resistor and the resistor is electrically connected to the monitoring circuit node, or the resistor is electrically connected to the source terminal of the second transistor and the anode of diode is electrically connected to resistor and the cathode of diode is connected to monitoring circuit node, wherein the output terminal of the first current source is electrically connected to the control electrode of the first transistor, wherein the drain terminal of the first transistor is electrically connected to the control electrode of the second transistor, and an amplifier having negative gain having an input electrically connected to the output terminal of the second current source and having an output for outputting the switch-on signal for the electronic switch, wherein the output of the amplifier is electrically connected to the control electrode of the electronic switch or is electrically connected to same with the interposition of a diode having a cathode electrically connected to the control electrode of the electronic switch and an anode electrically connected to the output of the amplifier.

14. The device according to claim 1, comprising:

a first transistor having a source terminal, a drain terminal and a control electrode, a second transistor having a source terminal, a drain terminal and a control electrode, a first current source for an output of a first current having an output terminal, wherein the output terminal of the first current source is electrically connected to the drain terminal of the first transistor, the source terminal of which is electrically connected to the reference potential, a second current source for outputting a second current having an output terminal which is electrically connected to the drain terminal of the second transistor, the source terminal of which is electrically connected to the monitoring circuit node with an interposition of a resistor or a diode, anode of which is electrically connected to the source terminal of the second transistor and cathode of which is electrically connected to the monitoring circuit node, wherein the output terminal of the first current source is electrically connected to the control electrode of the first transistor, wherein the drain terminal of the first transistor is electrically connected to the control electrode of the second transistor, and an amplifier having negative gain having an input electrically connected to the output terminal of the second current source and having an output for outputting the switch-on signal for the electronic switch, wherein the output of the amplifier is electrically connected to the control electrode of the electronic switch or is electrically connected to same with the interposition of a diode having a cathode electrically connected to the control electrode of the electronic switch and an anode electrically connected to the output of the amplifier.

15. The device according to claim 1, comprising:

a first transistor having a source terminal, a drain terminal and a control electrode, a second transistor having a source terminal, a drain terminal and a control electrode, a first current source for the output of a first current having an output terminal, wherein the output terminal of the first current source is electrically connected to the drain terminal of the first transistor, the source terminal of which is electrically connected to the reference potential, a second current source for outputting a second current, having an output terminal which is electrically connected to the drain terminal of the second transistor, the source terminal of which is electrically connected to the monitoring circuit node, wherein the output terminal of the first current source is electrically connected to the control electrode of the first transistor, wherein the drain terminal of the first transistor is electrically connected to the control electrode of the second transistor, and an amplifier having negative gain having an input electrically connected to the output terminal of the second current source and having an output for outputting the switch-on signal for the electronic switch, wherein the output of the amplifier is electrically connected to the control electrode of the electronic switch or is electrically connected to same with an interposition of a diode having a cathode electrically connected to the control electrode of the electronic switch and an anode electrically connected to the output of the amplifier, and wherein a magnitude of the first current of the first current source is different from the magnitude of the second current of the second current source and/or the control electrode of the first transistor has a different magnitude than the control electrode of the second transistor and/or the first transistor has a threshold voltage, the magnitude of which is different from that of the threshold voltage of the second transistor.

16. The device according to claim 1, wherein a potential which is above the reference potential is applied to the leakage circuit node.

17. The device according to claim 1 wherein the semiconductor substrate doped with charge carriers of the first conductivity type is a p-doped semiconductor substrate, the plurality of regions doped with charge carriers of the second conductivity type are n-doped N-regions, and the parasitic bipolar lateral structure being formed is a parasitic NPN lateral structure.

18. The device according to claim 1, wherein the activating element is configured to actuate an airbag or belt tensioner.

19. A device for monitoring a potential of a monitoring circuit node of a CMOS circuit, comprising the monitor circuit node, the monitoring circuit node lying in a region doped with charge carriers of a second conductivity type, or being electrically connected to one or more such regions, the one or more such doped regions being formed in a semiconductor substrate doped with charge carriers of a first conductivity type opposite to the second conductivity type, the semiconductor substrate having a plurality of doped regions, which each form electronic components or in which electronic components are formed, and being acted upon by a substrate potential, the CMOS circuit having a reference potential and an output driver stage for actuating an activating element of a passive vehicle safety system, wherein the output driver stage has two external terminal contacts which are to be led out or which are led out and a high-side output transistor, as well as a low-side output transistor, each of which is connected to a different one of the two external terminal contacts, wherein each of the external contacts is configured to connect to the actuating or activating element, and wherein the monitoring circuit node includes at least one of the two external contacts configured to be connected to the actuating or activating element, a parasitic bipolar lateral structure being formed, between the doped region having the monitoring circuit node and at least one doped region adjacent to this doped region or between at least one of the doped regions, to which the monitoring circuit node is electrically connected, and a doped region adjacent to this doped region or a doped region adjacent to one of these doped regions, the device further comprising:

a comparator circuit for comparing the potential of the monitoring circuit node with a reference potential which is equal to or lower than the reference potential or equal to both the substrate potential and the reference potential or lower than both the substrate potential and the reference potential, wherein the comparator circuit directly or indirectly generates a switching signal for switching an electronic switch to conduction, said electronic switch being able to be arranged between the monitoring circuit node and a leakage circuit node for discharging current, when a detected potential value is lower than or equal to the reference potential, and thus the generation of a substrate current in the bipolar later in the semiconductor substrate is suppressed, and wherein the electronic switch is the low-side output transistor of the output driver stage and the monitoring circuit node is the external terminal contact of the output driver stage which is connected to the low-side output transistor.

20. The device according to claim 19, wherein the region doped with charge carriers of the second conductivity type is an n-doped region, the semiconductor substrate doped with charge carriers of the first conductivity type is a p-doped semiconductor substrate, and the parasitic bipolar later structure being formed is a parasitic bipolar NPN lateral structure.

21. The device according to claim 19, wherein the activating element is configured to actuate an airbag or belt tensioner.

22. A method for preventing a laterally directed substrate current from being generated in a semiconductor substrate doped with charge carriers of a first conductivity type in which a CMOS circuit is integrated and which has a plurality of regions doped with charge carriers of a second conductivity type that is opposite to a first conductivity type, which each form electronic components or in which electronic components are each formed, a monitoring circuit node, which lies in one of the doped regions or is electrically connected to one or more of the doped regions and is to be monitored with regard to its potential, the semiconductor substrate having a substrate potential applied thereto, the CMOS circuit having a reference potential and an output driver stage for actuating an activating element of a passive vehicle safety system, wherein the output driver stage has two external terminal contacts which are to be led out or which are led out and a high-side output transistor, as well as a low-side output transistor, each of which is connected to a different one of the two external terminal contacts, wherein each of the external contacts is configured to connect to the actuating or activating element, and wherein the monitoring circuit node includes at least one of the two external contacts configured to be connected to the actuating or activating element, a parasitic bipolar lateral structure being formed, between the doped region having the monitoring circuit node and at least one doped region adjacent to this doped region or between at least one of the doped regions, to which the monitoring circuit node is electrically connected, and a doped region adjacent to this doped region or a doped region adjacent to one of these doped regions, comprising, during operation of the CMOS circuit:

detecting a potential value representing the potential at the monitoring circuit node, comparing the detected potential value with a reference potential equal to or lower than the substrate potential, or equal to or lower than the reference potential, or equal to both the substrate potential and the reference potential, or lower than both the substrate potential and the reference potential, and connecting the monitoring circuit node to a leakage circuit node serving to discharge current when the potential value is equal to or lower than the reference value, whereby the generation of a substrate current in the bipolar later in the semiconductor substrate, is suppressed, detecting the potential of the external terminal contact of the output driver stage, which is connected to the low-side output transistor, and connecting this external terminal contact to the leakage circuit node by switching to conduction of the low-side output transistor of the output driver stage which is connected to the leakage circuit node.

23. The method according to claim 22, wherein the substrate doped with charge carriers of the first conductivity type is a p-doped semiconductor substrate, the plurality of regions doped with charge carriers of the second conductivity type are n-doped N-regions and the parasitic bipolar lateral structure being formed is a parasitic NPN lateral structure.

24. The method according to claim 22, wherein the activating element is configured to actuate an airbag or belt tensioner.

25. A device for use in an integrated CMOS circuit, which is integrated in a semiconductor substrate doped with charge carriers of a first conductivity type, in particular in a p-doped semiconductor substrate, the semiconductor substrate having a plurality of regions doped with charge carriers of a second conductivity type that is opposite to the first conductivity type, in particular a plurality of n-doped N-regions, which each form electronic components or in which electronic components are each formed, a monitoring circuit node, which lies in one of the doped regions or is electrically connected to one or more of the doped regions and is to be monitored with regard to its potential, the semiconductor substrate having a substrate potential applied thereto, the CMOS circuit having a reference potential and a parasitic bipolar lateral structure being formed, in particular a parasitic bipolar NPN lateral structure, between the doped region having the monitoring circuit node and at least one doped region adjacent to this doped region or between at least one of the doped regions, to which the monitoring circuit node is electrically connected, and a doped region adjacent to this doped region or a doped region adjacent to one of these doped regions, comprising:

a current source, an ohmic resistor and a first transistor, which are connected in series between a supply potential and the reference potential, wherein the first transistor has a conduction path arranged between the ohmic resistor and the reference potential and a control electrode, wherein the current source feeds a current into a first circuit node of the series circuit composed of the resistor and the first transistor, wherein the first circuit node and the control electrode of the first transistor are electrically connected to one another, and a second transistor having a conduction path and a control electrode, wherein the conduction path of the second transistor is connected between the monitoring circuit node and a leakage circuit node, a second circuit node of the series circuit which is arranged between the ohmic resistor and the first transistor and is electrically connected to the control electrode of the second transistor, wherein the second transistor conducts when the potential of the monitoring circuit node undershoots a predetermined reference value, which is defined by, among other things, the resistor and/or threshold voltages of the two transistors or a difference in the threshold voltages of the two transistors and/or sizes of the control electrodes of the two transistors or the difference in the sizes of the control electrodes of the two transistors.

* * * * *